(12) United States Patent
Ito et al.

(10) Patent No.: US 7,225,390 B2
(45) Date of Patent: May 29, 2007

(54) SEMICONDUCTOR MEMORY DEVICE PROVIDED WITH ERROR CORRECTING CODE CIRCUITRY

(75) Inventors: Yutaka Ito, Tokyo (JP); Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 384 days.

(21) Appl. No.: 10/617,040

(22) Filed: Jul. 11, 2003

(65) Prior Publication Data

US 2004/0008562 A1 Jan. 15, 2004

(30) Foreign Application Priority Data

Jul. 11, 2002 (JP) ............................. 2002-203334

(51) Int. Cl.
*H03M 13/00* (2006.01)

(52) U.S. Cl. ..................................... 714/777; 714/710

(58) Field of Classification Search ................ 714/763, 714/718, 710, 801, 777
See application file for complete search history.

(56) References Cited

U.S. PATENT DOCUMENTS

| | | | | |
|---|---|---|---|---|
| 4,688,219 A | * | 8/1987 | Takemae | 714/711 |
| 4,730,320 A | * | 3/1988 | Hidaka et al. | 714/766 |
| 5,134,616 A | * | 7/1992 | Barth et al. | 714/711 |
| 5,307,356 A | * | 4/1994 | Fifield | 714/765 |
| 5,313,425 A | * | 5/1994 | Lee et al. | 365/201 |
| 5,638,385 A | * | 6/1997 | Fifield et al. | 714/763 |
| 5,784,391 A | * | 7/1998 | Konigsburg | 714/773 |
| 6,697,992 B2 | * | 2/2004 | Ito et al. | 714/763 |
| 2003/0115538 A1 | * | 6/2003 | Derner et al. | 714/773 |

FOREIGN PATENT DOCUMENTS

| | | |
|---|---|---|
| JP | 1-223700 B | 9/1989 |
| JP | 6-89595 A | 3/1994 |
| JP | 8-31196 C | 2/1996 |
| JP | 10-326497 A | 12/1998 |
| JP | 1-133299 A | 10/2006 |

\* cited by examiner

*Primary Examiner*—Albert Decady
*Assistant Examiner*—Mujtaba K. Chaudry
(74) *Attorney, Agent, or Firm*—Sughrue Mion, PLLC

(57) ABSTRACT

A semiconductor synchronous dynamic random access memory (SDRAM) device capable of correcting bits having a low error rate in a Pause Refresh Tail distribution and of reducing a data holding current by lengthening a refresh period so that the refresh period exceeds a period for a Pause Refresh real power. The semiconductor memory device is made up of a 16-bit SDRAM having a Hamming Code and including an ECC (Error Correcting Code) circuit made up of an encoding circuit controlled by a first test signal to output a parity bit corresponding to an information bit, a decoding circuit controlled by second test signal to output an error location detecting signal indicating an error bit in codeword, and an error correcting circuit controlled by a third test signal to input an error location detecting signal and to output an error bit in a reverse manner.

14 Claims, 19 Drawing Sheets

FIG.13 RELATED ART

RELATED ART

FIG.19 *RELATED ART* bit number of pause failure per one code word [bits/word]

SEMICONDUCTOR MEMORY DEVICE PROVIDED WITH ERROR CORRECTING CODE CIRCUITRY

BACKGROUND OF THE INVENTION

1. Field of the Invention

The present invention relates to a semiconductor memory device and more particularly to the semiconductor memory device being provided with an error correcting code (ECC) circuit.

The present application claims priority of Japanese Patent Application No. 2002-203334 filed on Jul. 11, 2002, which is hereby incorporated by reference.

2. Description of the Related Art

A DRAM (Dynamic Random Access Memory) is employed in a storage section of various information devices such as personal computers and, as an amount of information increases, to process (that is, to write and read) information made up of multiple bits also increases. However, as such information consisting of multiple bits to be processed increases, an error occurs inevitably in part of bits of the information when being transmitted. To solve this problem, that is, to improve reliability in the transmission of the information, a DRAM with an ECC circuit having a function of detecting and correcting error bits is provided. The ECC (Error Correcting Code) circuit is configured by using a known Hamming Code. It is known that the Hamming Code is a self-correcting code that can detect and corrects one bit error out of multiple bits.

On the other hand, an SDRAM (Synchronous DRAM) is becoming widespread which enables a high-speed access and is configured so as to operate in synchronization with a clock signal fed from an outside. In such the above SDRAM, an operation speed can be improved several times compared with the conventional DRAM configured so as to operate in a mode being asynchronous to an external signal.

However, such the SDRAM as described above has a problem of a Pause Refresh Tail distribution of information to be stored in a memory cell, that is, a problem of a Pause Refresh failure. Here, time during which a memory cell was left without any process being performed after data had been written thereon is called Pause time. A Pause Refresh test (also called "Pause test") is carried out to check whether data can be read normally from the memory cell after a lapse of a set Pause time. If nothing is done, since data having been written is corrupted by a leakage current, rewriting (refresh) operation is required before data is corrupted.

A Pause Refresh distribution being produced as a result from a Pause Refresh test, which represents Pause Refresh real power occurring until the data is corrupted by the leakage current after each bit has been written, is given as two Gaussian distributions including a Pause Refresh normal distribution being a good distribution which accounts for about 99.9% of the total distribution and a Pause Refresh Tail distribution being a poor distribution which accounts for remaining error of about 0.1% of the total distribution. In the SDRAM, in order to greatly reduce a data holding current, it is necessary to lengthen a refresh period so that the refresh period exceeds a period for the Pause Refresh real power to efficiently improve and correct the Pause Refresh Tail distribution (error rate≈0.01% of random bits), Thus, by greatly reducing a data holding current, reduction in power consumption of the SDRAM can be achieved.

Such the DRAM with the ECC circuit described above is disclosed in, for example, Japanese Patent No. 2539950 (Japanese Patent Application Laid-open No. Hei 6-89595).

The disclosed DRAM has a 128+9 bit SRAM (Static Random Access Memory) internally and is configured so that access to an outside device can obtained through the SRAM. Moreover, the DRAM with the ECC circuit as described above is disclosed in, for example, Japanese Patent Application Laid-open No. Hei 10-326497. The disclosed DRAM has a configuration with specifications that can comply with packet input/output specifications as employed in a RDRAM (Rambus DRAM).

There is a problem in that, since such the conventional semiconductor memory devices as described above cannot be applied to an SDRAM, when the Pause Refresh Tail distribution is to be improved and corrected, if bits have a low error rate, the Pause Refresh Tail distribution cannot be efficiently improved and corrected and therefore even by lengthening a refresh period so that the refresh period exceeds a period for the Pause Refresh real power, it is impossible to greatly reduce a data holding current.

In the case of the DRAM disclosed in the Japanese Patent No. 2539950, since access to the outside device is obtained through an SRAM made up of 128+9 bits, when a writing operation is performed, after data has been read once to the SRAM (that is, a pre-fetching operation has been performed), writing to a memory cell is performed and therefore redundant time has to be provided during writing operations of the SDRAM. That is, writing of the SDRAM is completed by simultaneously setting a writing command, data and a Y address (address of a device to which the writing is done) and time required for the above pre-fetching operation is not needed and is completed only by one setting. When the ECC circuit is mounted internally as in the case of the DRAM disclosed as above, since data has to be set after a two-cycle delay or a three-cycle delay from a writing command, three cycles or four cycles are needed before an operation is completed. Therefore, since the above pre-fetching operation is required, specifications for the SDRAM cannot be met.

Next, in the case of the DRAM disclosed in the Japanese Patent Application No. Hei 10-326497, since the DRAM has a configuration with specifications that can comply with packet input/output specifications, packet data has to be prepared and since configurations of the DRAM are basically different from those of the SDRAM, the disclosed DRAM cannot be applied to the SDRAM as in the case of the DRAM disclosed in Japanese Patent No. 2539950.

SUMMARY OF THE INVENTION

In view of the above, it is an object of the present invention to provide a semiconductor memory device being capable of efficiently correcting bits having a low error rate in a Pause Refresh Tail distribution and of greatly reducing a data holding current by lengthening a refresh period so that the refresh period exceeds a period for a Pause Refresh real power.

According to a first aspect of the present invention, there is provided a semiconductor memory device including:

a memory cell area made up of a plurality of memory cells and having an information bit area which information bits are written in and/or read from and a parity bit area which parity bits are written in and/or read from, and a redundant circuit to replace error bits contained in the information bits and/or the parity bits; and an error correcting code (ECC) circuit to perform error correcting processing, using a Hamming Code whose cord length is 72 or less on data including the information bits and the parity bits being written in and/or read from the information bit area or the parity bit area in the memory array; and wherein a combined use of redundant correcting processing to correct the error bits using a redundant circuit in the memory array with the error correcting processing using the Hamming Code in the ECC circuit is made possible.

According to a second aspect of the present invention, there is provided a semiconductor memory device including:

a memory cell area made up of a plurality of memory cells and having an information bit area which information bits are written in and/or read from and a parity bit area which parity bits are written in and/or read from, and a redundant circuit to replace error bits contained in the information bits and/or the parity bits; and an error correcting code (ECC) circuit to perform error correcting processing, using a Hamming Code whose cord length is 72 or less on data including the information bits and the parity bits being written in and/or read from the information bit area or the parity bit area in the memory array; and wherein a combined use of redundant correcting processing to correct the error bits using a redundant circuit in the memory array with the error correcting processing using the Hamming Code in the ECC circuit is made possible.

In each of the first and second aspects, a preferable mode is one wherein, when reading processing is performed on the information bit area or the parity bit area, the data on which the error correcting processing has been performed is output to only an outside of the memory array without being rewritten into the information bit area or the parity area.

Also, another preferable mode is one wherein, when a codeword made up of bits occurs which is beyond a correcting capability of the error correcting processing using the Hamming Code, the redundant correction processing on the error bits using the redundant circuit is made.

Also, still another preferable mode is one wherein the error correcting code (ECC) circuit includes an encoding circuit to output, by arithmetic operations, the parity bit corresponding to the information bit, a decoding circuit to output an error location detecting signal indicating an error bit out of all bits contained in the codeword, and an error correcting circuit to input the error location detecting signal and to output an error bit in a reverse manner.

An additional preferable mode is one wherein the encoding circuit includes a syndrome tree in which a plurality of AND circuits to which a first test signal is fed is connected to a plurality of exclusive OR circuits in a manner to provide a specified relationship.

A still additional preferable mode is one wherein the decoding circuit includes a syndrome tree in which a plurality of exclusive OR circuits is connected to one another so that a plurality of bits of the information bits and a plurality of bits of the parity bits are input and a plurality of bits of syndromes is output and decoders to which a plurality of NAND circuits to which a plurality of bits of the syndromes is input and in which a plurality of bits of the error location detecting signals are output and a plurality of AND circuits to which a second test signal is fed are connected to one another in a manner to provide a specified relationship.

A furthermore preferable mode is one wherein, in the error correcting circuit, a plurality of exclusive OR circuits to which a plurality of bits of the error location detecting signals is input together with a plurality of bits of the information bits and a plurality of bits of the parity bits and a plurality of switches to which a third test signal is fed are connected to one another in a manner to provide a specified relationship so that the error bits are output in a reverse manner.

A still furthermore preferable mode is one wherein a memory array including the memory cell area and the redundant circuit.

With the above configuration, the semiconductor memory device of the present invention has the information bit area in which the information bit is written or read, the parity bit area which the parity bit is written in and read from, the memory array made up of the plurality of memory cells having at least the one redundant circuit to replace the fail bits contained in the information bits or the parity bits, and the ECC circuit to perform the error correction processing, using the Hamming Code whose cord length is about 72 or less on the data including the information bits and the parity bits being written to and read from the information bit area or the parity bit area in the memory array, the combined use of the redundant correcting processing to correct the fail bits using the redundant circuit in the memory array with the error correcting processing using the Hamming Code in the ECC circuit is made possible. Therefore, in a Pause Refresh Tail distribution, by correcting the bits having a low error rate and by making longer a refresh period so that the refresh period exceeds a period for a Pause Refresh real power, data holding currents can be greatly reduced.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
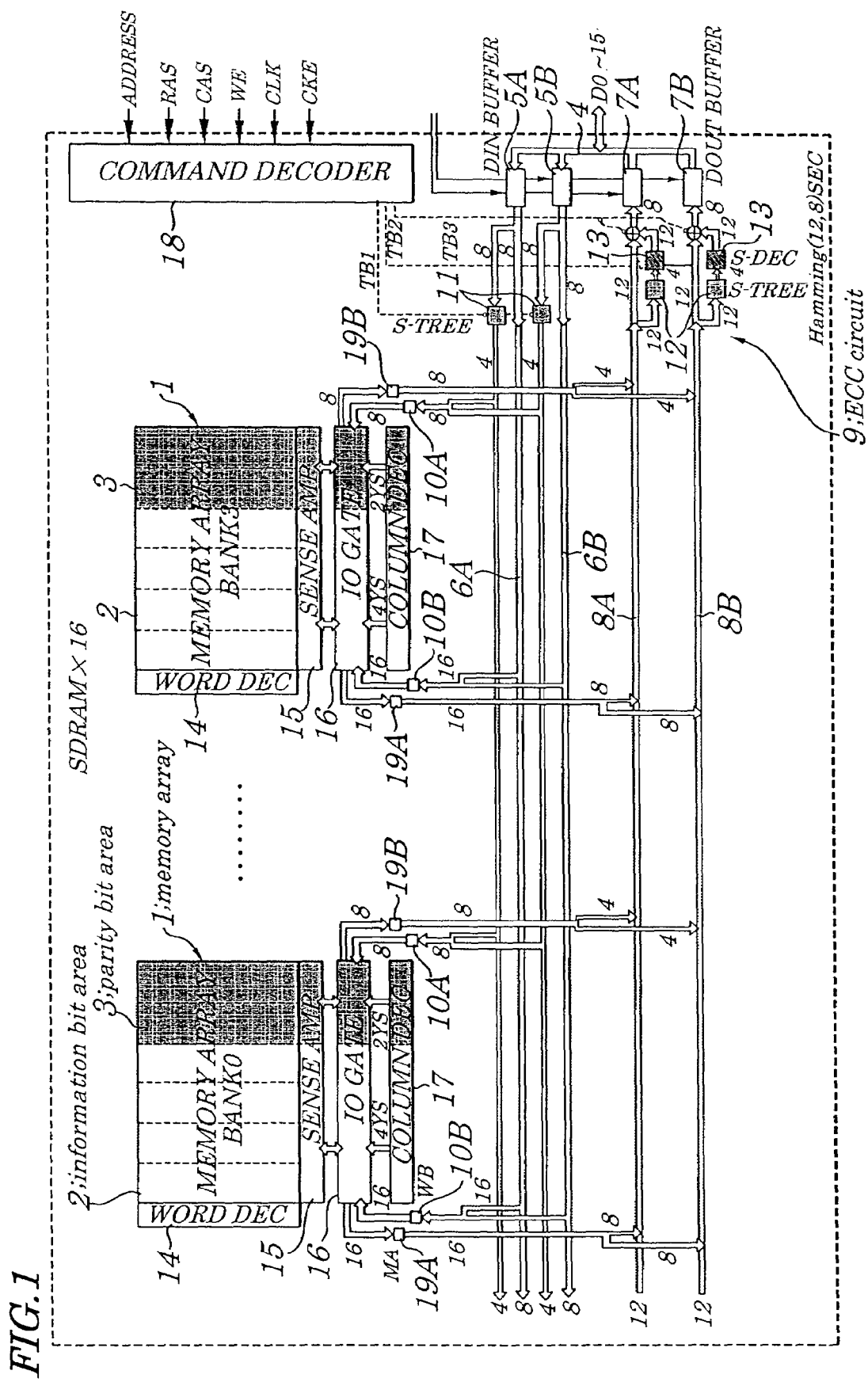
FIG. 1 is a schematic block diagram showing configurations of a semiconductor memory device according to a first embodiment of the present invention.
Figure 2:
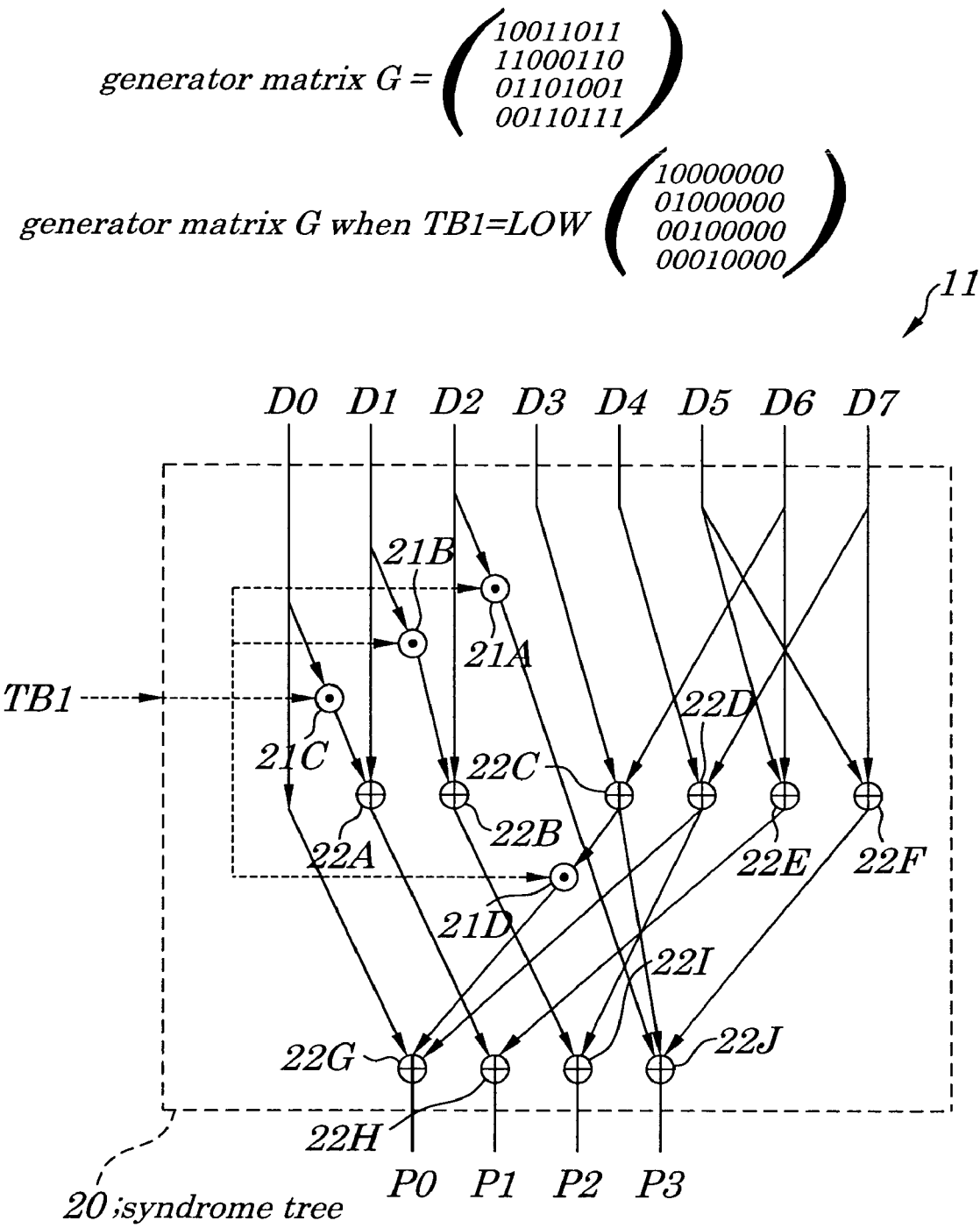
FIG. 2 is a diagram for showing configuration of an encoding circuit of the semiconductor memory device according to the first embodiment of the present invention.
Figure 3:
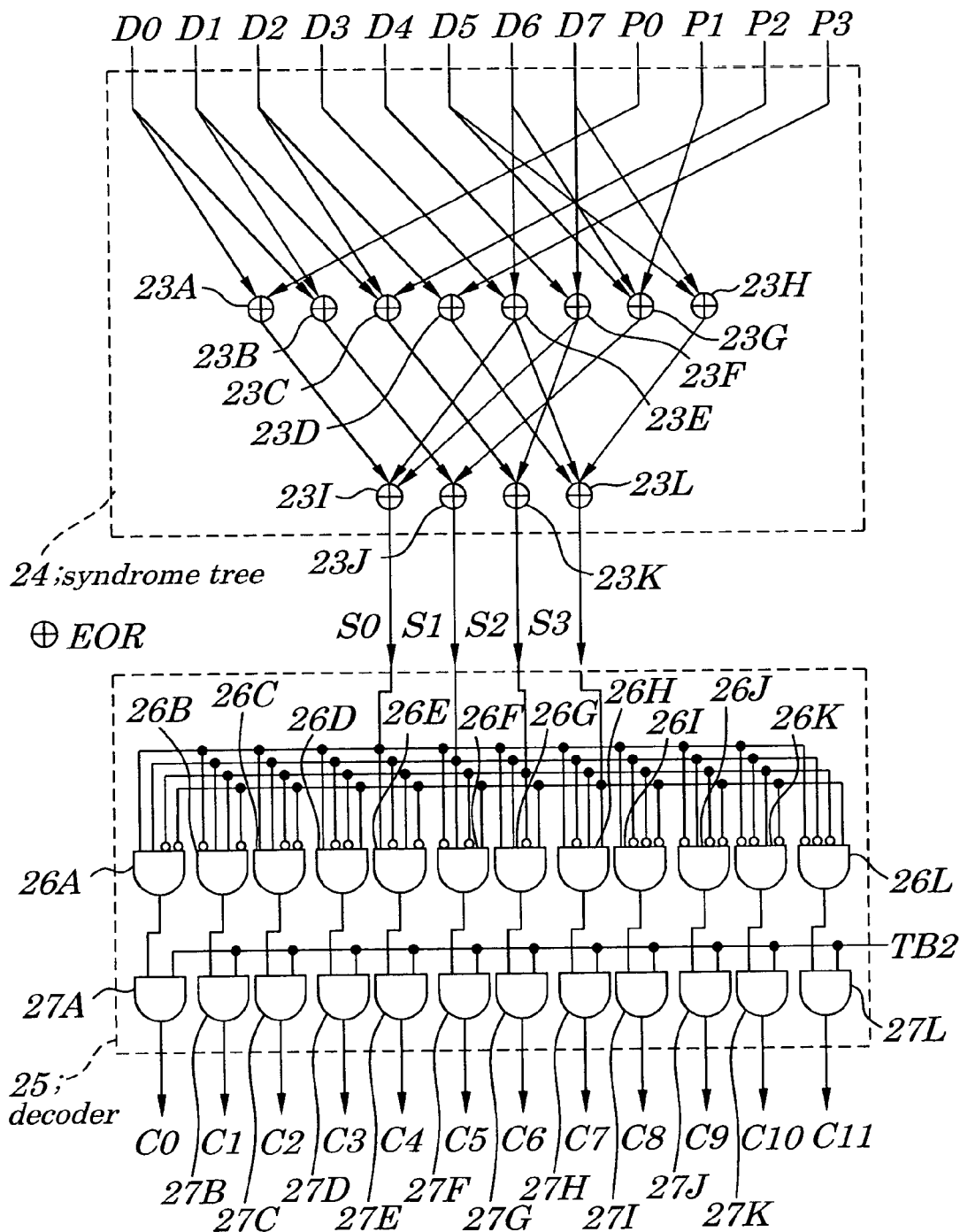
FIG. 3 is a diagram for showing configuration of a decoding circuit of the semiconductor memory device according to the first embodiment of the present invention.
Figure 4:
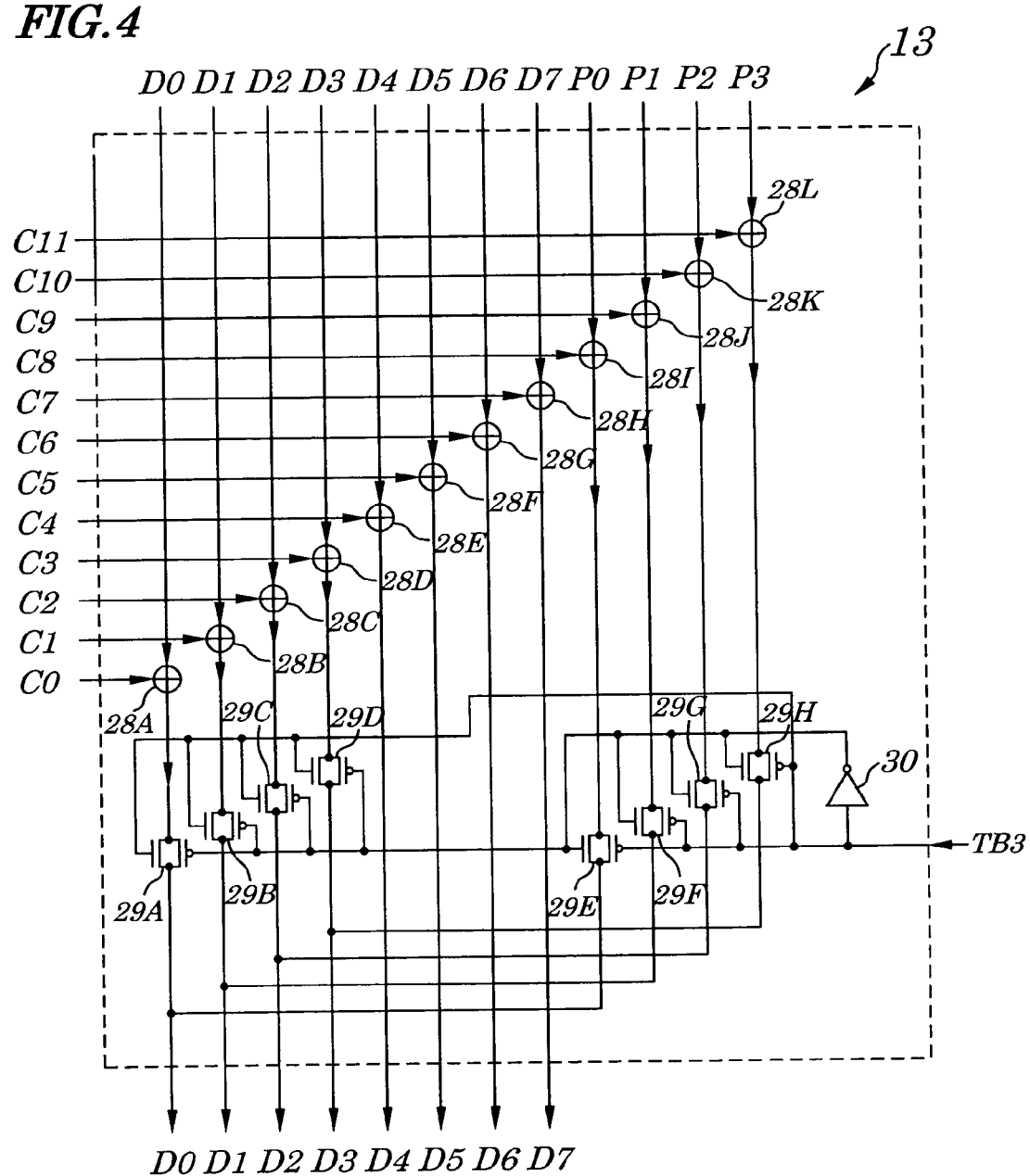
FIG. 4 is a diagram for showing configuration of an error correcting circuit incorporated in the semiconductor memory device according to the first embodiment of the present invention.

FIG. 1 is a schematic block diagram showing configurations of a semiconductor memory device according to a first embodiment of the present invention. FIG. 2 is a diagram for showing configuration of an encoding circuit 11 of the semiconductor memory device according to the first embodiment, FIG. 3 is a diagram for showing configuration of a decoding circuit 12 of the same semiconductor memory device, and FIG. 4 is a diagram for showing configuration of an error correcting circuit 13 of the same semiconductor memory device. Configurations of the semiconductor memory device of the first embodiment are described by referring to FIG. 1 to FIG. 4. The semiconductor memory device of the first embodiment, as shown in FIG. 1, is made up of a 16-bit SDRAM having a Hamming Code (12, 8)SEC, which includes memory arrays (MEMORY ARRAY) 1 made up of a plurality of memory cells and divided into four banks (first BANK0 to fourth BANK3) each containing an information bit area 2 and a parity bit area 3, input bus lines 6A and 6B to divide 16 bits of information bits being input and output through an input and output data bus 4 into 8 bits of information bits and to input each of the divided information bits through input buffers 5A and 5B, output bus lines 8A and 8B to divide 16 bits of information bits read from the memory array 1 into 8 bits of information bits and to output them and to divide 8 bits of parity bits read from the memory array 1 into 4 bits of parity bits and output them, and an ECC circuit 9 being connected to the input bus lines 6A and 6B and to the output bus lines 8A and 8B. Moreover, the numeral "8" contained in the Hamming Code (12, 8) SEC represents information bits, whereas the numeral "12" contained in the Hamming Code (12, 8) SEC represents a code length of a codeword obtained by adding 4 bits of parity bits to the 8 bits of information bits.

The ECC circuit 9 is made up of encoding circuits 11 each being controlled by a test signal TB1 so as to produce and output, by arithmetic operations, a parity bit corresponding to an information bit and to output the produced the parity bit as described later, decoding circuits 12 each being controlled by a test signal TB2 so as to output an error location detecting signal indicating an error bit out of bits making up a codeword, and error correcting circuits (ERROR CORRECTOR) 13 each being controlled by a test signal TB3 so as to input an error location detecting signal and to output an error bit in a reverse manner. The ECC circuit 9 is mounted on a same semiconductor chip as the memory array 1 in a form of a "so called" "On-Chip ECC".

Each of the memory arrays 1 includes a word decoder (WORD DECODER) 14, a sense amplifier (SENSE AMP) 15, an input/output gate (I/O GATE) 16, a column decoder (COLUMN DECODER) 17, and a redundant circuit (not shown) to replace bad bits in information bits or parity bits with normal bits. Moreover, the semiconductor memory device of the first embodiment further includes a command decoder (COMMAND DECODER) 18 to input an address (ADDRESS) signal, a RAS (ROW ADDRESS STROBE) signal, a CAS (COLUMN ADDRESS STROBE) signal, a write enable (WE) signal, a clock (CLK) signal, a clock enable (CKE) signal, or a like therein from an external and to output respectively the test signals TB1 to TB3 to the ECC circuit 9.

Next, configurations of the encoding circuits 11 in the ECC circuit 9 corresponding to the Hamming Code (12, 8) SEC that the semiconductor memory device has are described by referring to FIG. 2. Each of the encoding circuits 11 (here, two pieces of the encoding circuits 11) is so constructed as to have a syndrome tree 20 configuration in which 8 bits of information bits D0 to D7 are input from each of the input bus lines 6A and 6B, four pieces of AND circuits 21A to 21D and ten pieces of exclusive OR circuits (EOR) 22A to 22J are connected so as to produce such a 5 relationship as shown in FIG. 2 the test signal TB1 is fed to four pieces of AND circuits 21A to 21D. Moreover, each of the encoding circuits 11 is so configured that it produces, by arithmetic operations, 4 bits of parity bits P0 to P3 and outputs them which allow the ECC circuit 9 to make a specified error correction according to contents of the input 8 bits of the information bits D0 to D7. The 8 bits (4 bits× 2) of the parity bits output from two pieces of the encoding circuits 11 are written in the parity bit area 3 in the memory array 1 through a write buffer (WB) 10A and the input/output gates 16. In FIG. 2, a generator matrix "G" shown in its upper part is produced by arithmetic operations so that it becomes the generator matrix "G" shown just below in its lower part when a test signal TB1=L (low) level.

Next, configurations of the decoding circuits 12 in the ECC circuit 9 corresponding to the Hamming Code (12, 8) SEC that the semiconductor memory device of the first embodiment has are described by referring to FIG. 3. Each of the decoding circuits 12 is made up of a syndrome tree 24 and a decoder 25. In the syndrome tree 24, 12 pieces of exclusive OR circuits (EORs) 23A to 23L to which a total of twelve bits of read signals (read data) obtained by adding 8 bits of information bits D0 to D7 being an output obtained by dividing 16 bits of information bits read through a main amplifier 19A (FIG. 1) from the input/output gate 16 so that 8 bits of information bits are output to both of the two output bus lines 8A and 8B, to 4 bits of parity bits P0 to P3 obtained by dividing 8 bits of parity bits read through a main amplifier 19B from the input/output gate 16 so that 4 bits of the parity bits are output to both of the two output bus lines 8A and 8B is input, are connected so as to produce such a relationship as shown in the FIG. 3. In the syndrome tree 24, 4 bits of syndrome signals S0 to S3 are output according to contents of the 12 bits of the read signals.

The decoder 25 is made up of twelve pieces of NAND circuits 26A to 26L to which the syndrome signals S0 to S3 made up of 4 bits are fed and which are connected in a manner as shown in FIG. 3 and twelve pieces of AND circuits 27A to 27L to output bit error location detecting signals (correction data) C0 to C11 made up of 12 bits as a result of a receipt of an output from the NAND circuits 26A to 26L as one input and the test signal TB2 as another input. The decoder 25 is so configured that an error bit is output at a H (High) level. FIG. 3 shows one example of contents of an inspection matrix "H".

Next, configurations of the error correcting circuit 13 in the ECC circuit 9 corresponding to the Hamming Code (12, 8) SEC that the semiconductor memory device of the first embodiment has are described by referring to FIG. 4. Each of the error correcting circuits 13 is made up of twelve pieces of exclusive OR circuits 28A to 28L to which 12 bits of read signals made up of information bits D0 to D7 and parity bits P0 to P3 are fed respectively and to which error location detecting signals C0 to C11 made up of 12 bits are also fed respectively, eight pieces of switches 29A to 29H to which outputs from the exclusive OR circuits 28A to 28D and 28I to 28L are fed respectively and also to each of which the test signal TB3 is fed, and an inverter 30, and is configured so as to output read data (information bits) D0 to D7 obtained after error correcting processing.

Operations of the semiconductor memory device of the first embodiment are described. Its ordinary operation is explained first. Test signals TB1, TB2 and TB3 are set to be at a H (high) level.

(1) As shown in FIG. 1 to FIG. 4, 16 bits of information bits having been input from an external through the input and output data bus 4 are divided into the 8 bits of information bits D0 to D7 and the divided information bits D0 to D7 are fed through input buffers 5A and 5B to each of the encoding circuits 11 connected to the input bus lines 6A and 6B. Each encoding circuit 11 outputs, by arithmetic operations, 4 bits of the parity bits P0 to P3 corresponding to 8 bits of information bits D0 to D7 and, as a result, a total of 8 bits of parity bits is written into the parity bit area 3 in the memory array 1 through the write buffer 10A and the input/output gate 16. Likewise, 8 bits of the divided information bits D0 to D7 are added to another 8 bits of the divided information bits D0 to D7 and, as a result, a total of 16 bits of information bits is written into the information bit area 2 in the memory array 1 through a write buffer 10B and the input/output gate 16.

(2) The 16 bits of information bits read through the input/output gate 16 and the main amplifier 19A from the information bit area 2 in the memory array 1 are again divided into the 8 bits of information bits D0 to D7 and the 8 bits of parity bits read through the input/output gate 16 and the main amplifier 19B from the parity bit area 3 in the memory array 1 are also again divided into 4 bits of parity bits P0 to P3 and a total of 12 bits including 8 bits of the information bits D0 to D7 and 4 bits of the parity bits P0 to P3 is fed, as read data, to the decoding circuit 12 connected to the output bus lines 8A and 8B. The decoding circuit 12 outputs error location detecting signals C0 to C11 indicating an error bit out of the above 12 bits. An error bit out of the 12 bits is output at a H (high) level.

(3) The 12 bits of error location detecting signals (correction data) C0 to C11, together with 12 bits of read signals (read data) D0 to D7 and P0 to P3, are fed to the error correcting circuit 13, which performs error correcting processing by outputting an error bit signal having become high in a reverse manner and outputs 8 bits of read signals D0 to D7. The read signals D0 to D7 are output to the input and output data bus 4 through output buses 7A and 7B and, after having been restored to be 16 bits of information bits, are output to an outside. At this point, when reading operations are performed on the information bit area 2 or the parity bit area 3, the above data on which correcting processing has been already performed is output without being again rewritten into the information bit area 2 or the parity bit area 3. This is because the data on which correcting processing has been performed and stored in the memory array 1 can be read normally from an external, even when the data is not rewritten into the memory array 1.

Next, an operation for a probe test is described. The probe test is carried out with an aim of redundant correction to be made when a codeword being beyond correcting capability (that is, an error of 2 bits or more per one codeword) occurs, in order to improve efficiency of correcting the Pause Refresh Tail distribution of information being stored in a capacitor as described above, that is, to improve a correction rate of the Pause Refresh failure or to achieve a realistic correcting capability. To detect and make a redundant correction to a solid failure (a failure other than the Pause Refresh failure and a process failure occurring due to a foreign substance or a like such as a wiring short failure), an FBM (Fail Bit Map) for all bits including parity bits is acquired by using steps below, with the error correcting processing to be performed by the ECC circuit 9 being paused.

(1) Error correcting processing to be performed by the ECC circuit 9 is forcedly stopped with the test signal TB2 in the decoding circuit 12 shown in FIG. 3 being set at a L (low) level. This causes data obtained before the error correcting processing is performed to be output as error location detecting signals C0 to C11 fed from the decoding circuit 12. In this state, by performing a function test being ordinarily carried out on the information bit area 2, the FBM is obtained. The FBM is displayed on the display panel device (not shown) in two-dimensional manner so as to correspond to X and Y addresses and a bit having a PASS result is displayed, for example, by white dots and a bit having a FAIL result is displayed, for example, by black dots. Therefore, by obtaining such the FMB as displayed in two-dimensional manner, it is possible to get information about a state of a fail bit that (2) Then, the function test is carried out on the parity bit area 3 with the test signals TB1 and TB3 as shown in FIG. 2 to FIG. 4 being set at the L (low) level and the test signal TB2 being set at the H (high) level to obtain the FMB. Thus, information is obtained about a state of distributions of fail bits of not only information bits but also parity bits. At this time, four bits of information bits D0 to D3 are written into or read from the parity bit area 3 as they are, however, all of the remaining information bits D4 to D7 are set at a L (low) level. Moreover, whenever necessary, the write buffers 10A and 10B or main amplifiers 19A and 19B are deactivated and a function test for a desired data pattern is performed on all bits.

Next, in order to improve the Pause Refresh Tail distribution, that is, to detect and achieve an efficient correction to the Pause Refresh failure by using the ECC circuit 9, the FMB containing a parity bit occurring in a state where error correcting processing is performed is obtained by the following steps. Moreover, a redundant correction as described above is made to a fail bit occurring during the following steps.

(1) In an ordinary operation described above, by carrying out a long Pause Refresh test on the information bit area 2, the FBM is obtained. The long Pause Refresh test is a Pause test having longer Pause time exceeding a period for the Pause Refresh real power when compared with a Pause Refresh test that are carried out in an ordinary operation and, if bit correction is not made by the ECC circuit 9 during the long Pause Refresh test, a fail bit occurs.

(2) In a state in which the test signal TB2 in the decoding circuit 12 shown in FIG. 3 is set at the H (high) level, whereas the test signals TB1 and TB3 are set to the L (low) level, the long Pause Refresh test is carried out on the parity bit area 3 to obtain the FBM.

According to the semiconductor memory device of the first embodiment, since 16 bits of information bits is divided into 8 bits of information bits and two pieces of Hamming Codes (12, 8)SEC are provided, it is made possible to perform writing of minimum 8 bits by a DQM (Data Mask signal) and, therefore, an information bit length can be reduced to be 8 bits and parity bits can be reduced to be 4 bits. As a result, the semiconductor memory device of the first embodiment can comply with specifications of currently available SDRAMs.

Second Embodiment

Figure 5:
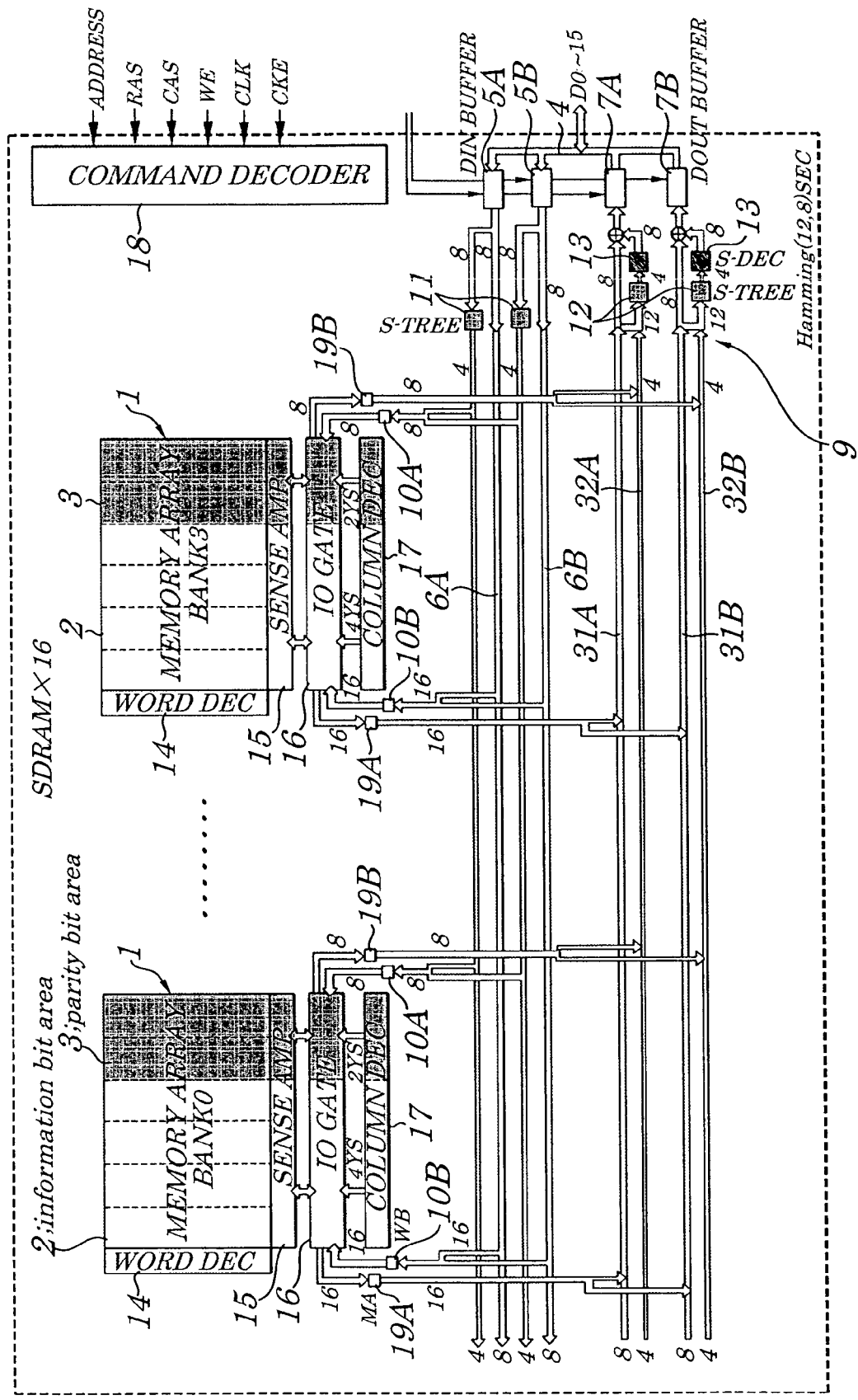
FIG. 5 is a diagram showing configurations of a semiconductor memory device according to a second embodiment of the present invention.
Figure 6:
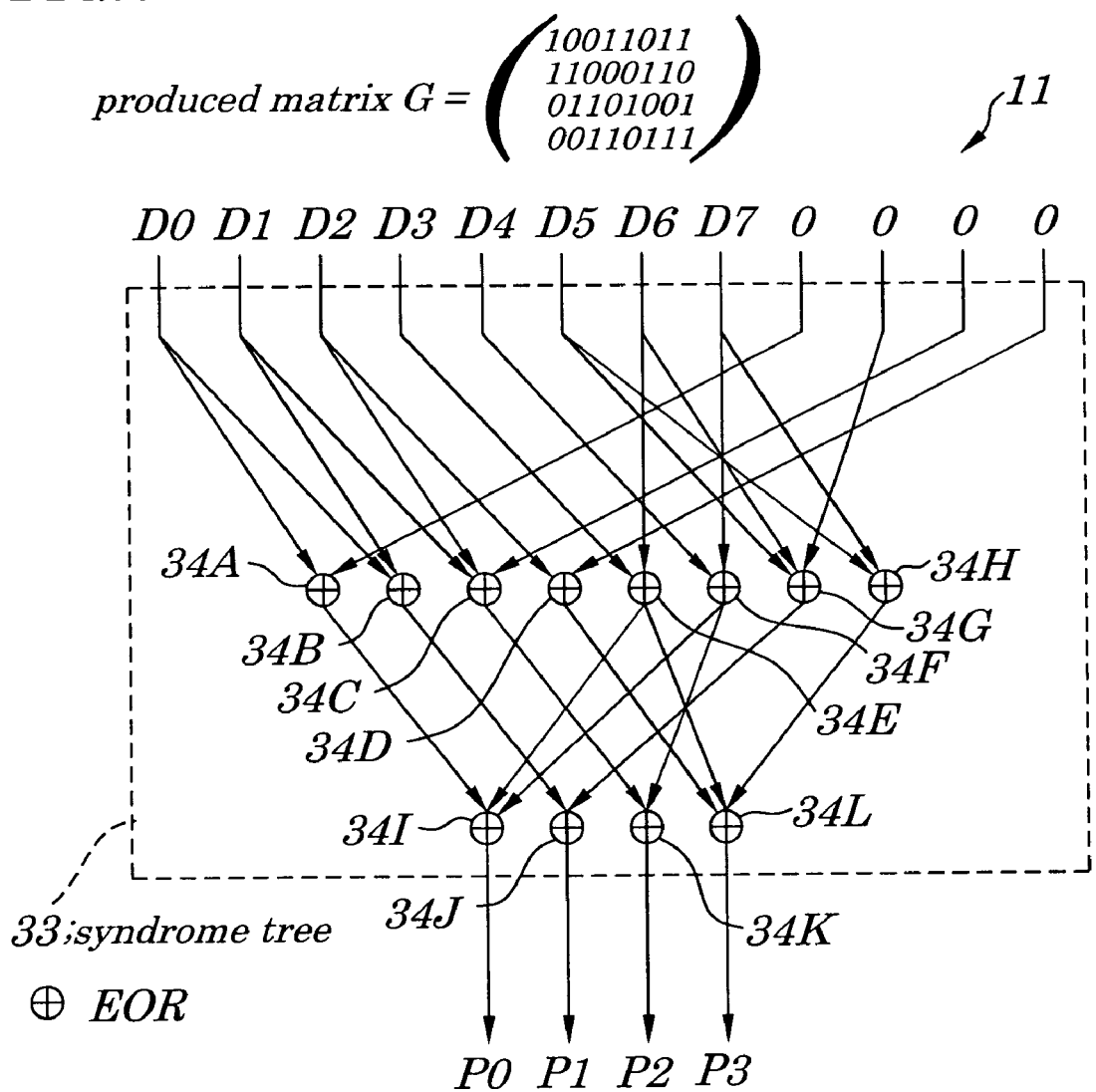
FIG. 6 is a diagram showing configurations of an encoding circuit of the semiconductor memory device according to the second embodiment of the present invention.
Figure 7:
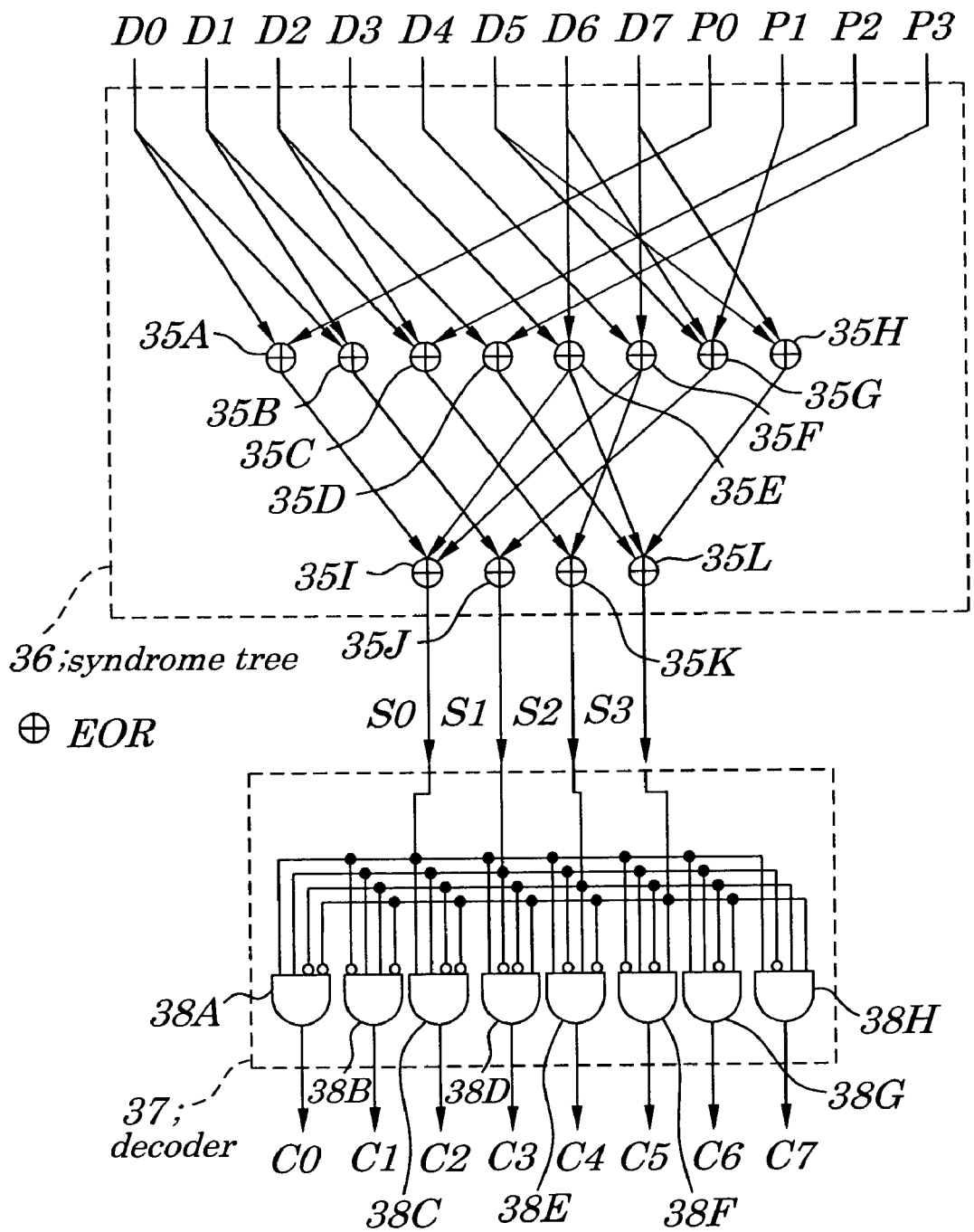
FIG. 7 is a diagram showing configurations of a decoding circuit of the semiconductor memory device according to the second embodiment of the present invention.

FIG. 5 is a diagram for showing configurations of a semiconductor memory device according to a second embodiment of the present invention. FIG. 6 is a diagram showing configurations of an encoding circuit 11 of the semiconductor memory device according to the second embodiment. FIG. 7 is a diagram showing configurations of a decoding circuit 12 of the semiconductor memory device according to the second embodiment. Configurations of the semiconductor memory device of the second embodiment differ greatly from those of the semiconductor memory device of the first embodiment in that, in a 16-bit SDRAM having a Hamming Code (12, 8) SEC, use of a test signal is made unnecessary and output bus lines to output information bits read from a memory array are separated from output bus lines to output parity bits read from the memory array. In the semiconductor memory device of the second embodiment, as shown in FIG. 5, output bus lines 31A and 31B to divide 16 bits of information bits read from memory array 1 into 8 bits of information bits and to output them are configured in a manner to be separated from output bus lines 32A and 32B to divide 8 bits of parity bits read from the memory array 1 into 4 bits of the parity bits and to output them. Moreover, the semiconductor memory device is so configured that use of test signals TB1 to TB3 is made unnecessary and direct access to a parity bit is made possible. By constructing as above, configurations of an ECC circuit 9 can be simplified.

Next, configurations of encoding circuits 11 in the ECC circuit 9 corresponding to a Hamming Code (12, 8) that the semiconductor memory device of the second embodiment has are described by referring to FIG. 6. Each of the encoding circuits 11 is so configured as to have a syndrome tree 33 in which twelve pieces of exclusive OR circuits (EORs) 34A to 34L to which 8 bits of information bits D0 to D7 and L (low) level signals are input are connected so as to produce such a relationship as shown in FIG. 6. Each of the encoding circuits 11 are so configured that 4 bits of parity bits P0 to P3 enabling the ECC circuit 9 to make a specified correction to bit errors are produced by arithmetic operations and are output according to contents of 8 bits of input information bits D0 to D7. The 8 bits (4 bits×2) of the parity bits output from two pieces of the encoding circuits 11 are written into a parity bit area 3 in the memory array 1 through a write buffer (WB) 10A and an input/output gate 16.

Next, configurations of decoding circuits 12 in the ECC circuit 9 corresponding to the Hamming Code (12, 8) SEC in the semiconductor memory device of the second embodiment are explained by referring to FIG. 7. Each of the decoding circuits 12 is made up of a syndrome tree 36 and a decoder 37. In the syndrome tree 36, twelve pieces of exclusive OR circuits (EORs) 35A to 35L to which a total of 12 bits of read signals (read data) obtained by adding 8 bits of information bits D0 to D7 being an output obtained by dividing 16 bits of information bits read through a main amplifier 19A from the input/output gate 16 so that 8 bits of information bits are output to both of the two output bus lines 31A and 31B to 4 bits of parity bits P0 to P3 obtained by dividing 8 bits of parity bits read through a main amplifier 19B from the input/output gate 16 so that 4 bits of the parity bits are output to both of the two output bus lines 32A and 32B is input, are connected so as to produce such a relationship as shown in FIG. 7. In the syndrome tree 36, 4 bits of syndrome signals S0 to S3 are output according to contents of the 12 bits.

The decoder 37 is made up of 8 pieces of NAND circuits 38A to 38H to which 4 bits of the syndrome signals S0 to S3 are input and which are so connected to one another that such a relationship as shown in FIG. 7 is produced. The decoder 37 is constructed so as to output 8 bits of error location detecting signals (to be used as correction data) C0 to C7. Here, an error bit is output at a H (high) level. Moreover, an error correcting circuit in the ECC circuit 9 has almost same configurations as the error correcting circuit 13 of the first embodiment shown in FIG. 4 and their drawings are omitted accordingly.

Normal operations of the semiconductor memory device of the second embodiment and its probe test are performed in the same ways as employed in the first embodiment.

Thus, according to the semiconductor memory device of the second embodiment, since 16 bits of information bits are divided into 8 bits of information bits and two Hamming Codes (12, 8) are provided, it is possible to perform almost the same operations as in the case of the first embodiment. Moreover, since the use of test signals is made unnecessary, it is possible to simplify the configurations of the semiconductor memory device more than with the case of the first embodiment.

Third Embodiment

Figure 8:
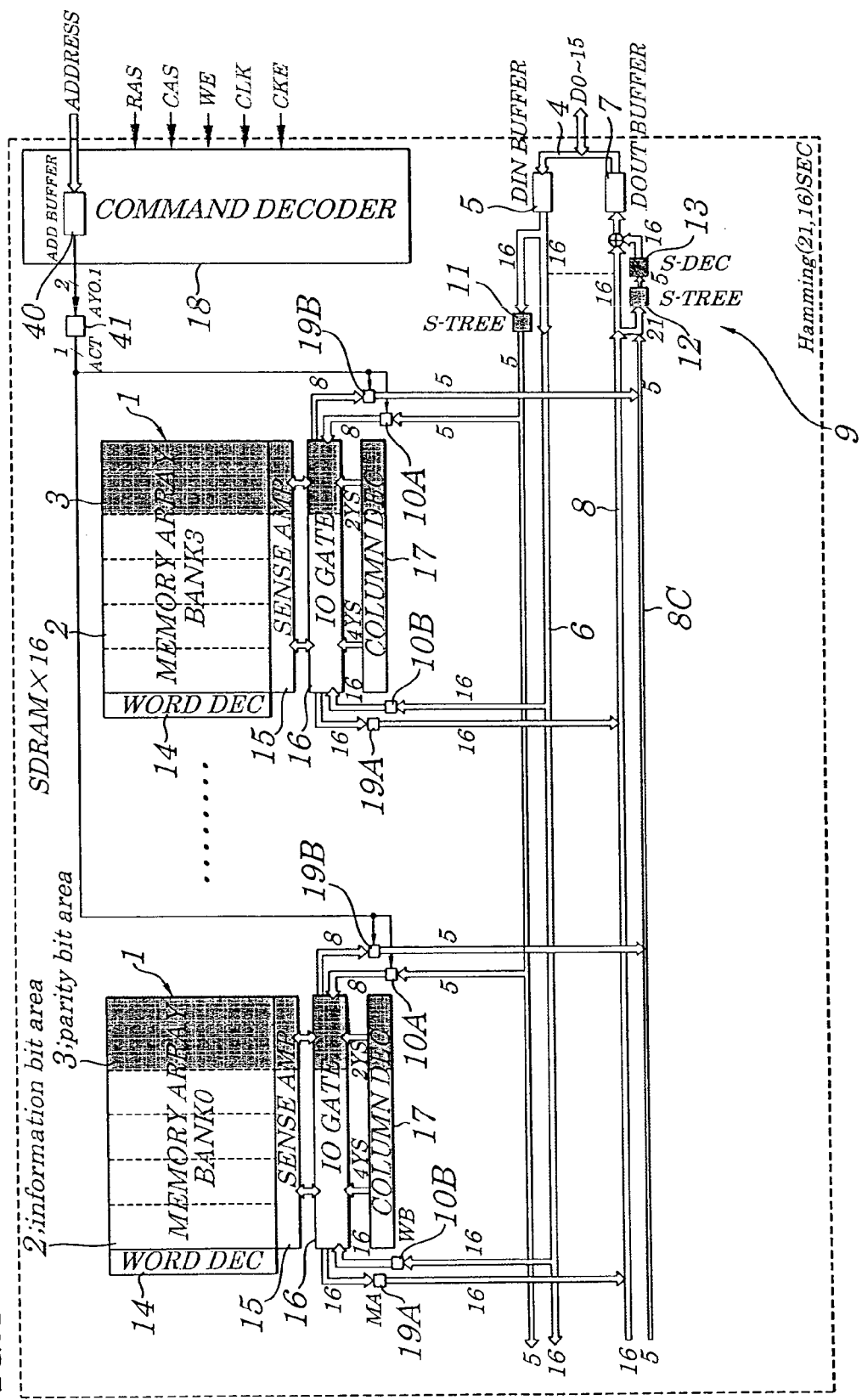
FIG. 8 is a diagram showing configurations of a semiconductor memory device according to a third embodiment of the present invention.

FIG. 8 is a diagram showing configurations of a semiconductor memory device according to a third embodiment of the present invention. Configurations of the semiconductor memory device of the third embodiment differ greatly from those of the above first embodiment in that a 16-bit SDRAM has a Hamming Code (21, 16).

The semiconductor memory device of the third embodiment, as shown in FIG. 8, includes an input bus line 6 to input 16 bits of information bits which are input and output through an input/output data bus 4 through an input buffer 5, an output bus line 8 to output 16 bits of information bits read from a memory array 1, an output bus line 8C to output 5 bits of parity bits read from the memory array 1, and an ECC circuit 9 placed on the input bus line 6 and output bus lines 8 and 8C. Moreover, the semiconductor memory device of the third embodiment is not so configured as to comply with specifications of DQM (Data Mask signal) and has an address controlling circuit for parity bits made up of a write buffer (BW)/main amplifier (MA) decoder 41 placed between an address buffer (ADD BUFFER) 40 mounted in a command decoder 18 and a write buffer (WB) 10A and a main amplifier (MA) 19B. The ECC circuit 9 of the third embodiment has almost same configurations as the ECC circuit 9 and the ECC circuit 9 of the first or the second embodiment and their drawings are omitted accordingly.

In the semiconductor memory device of the third embodiment, 16 bits of data are all handled as information bits and, by adding 5 bits of parity bits to the 16 bits of the data, a codeword is constructed and specifications for the DQM (Data Mask signal) are not met. Unlike in the case of the first and second embodiments in which 16 bits of information bits are divided, in the semiconductor memory device of the third embodiment, an information bit length is made longer and parity bits are made smaller.

Normal operations of the semiconductor memory device of the third embodiment and its probe test are performed in the same ways as employed in the first and second embodiment.

According to the semiconductor memory device of the third embodiment, since the Hamming Code (21, 16) SEC is provided and 16 bits of data are all handled as information bits and a codeword is constructed by adding 5 bits of parity bits to the 16 bits of data, an information bit length is made longer and the parity bits are made smaller compared with that in the first and second embodiment and, as a result, area demerits can be reduced.

Fourth Embodiment

Figure 9:
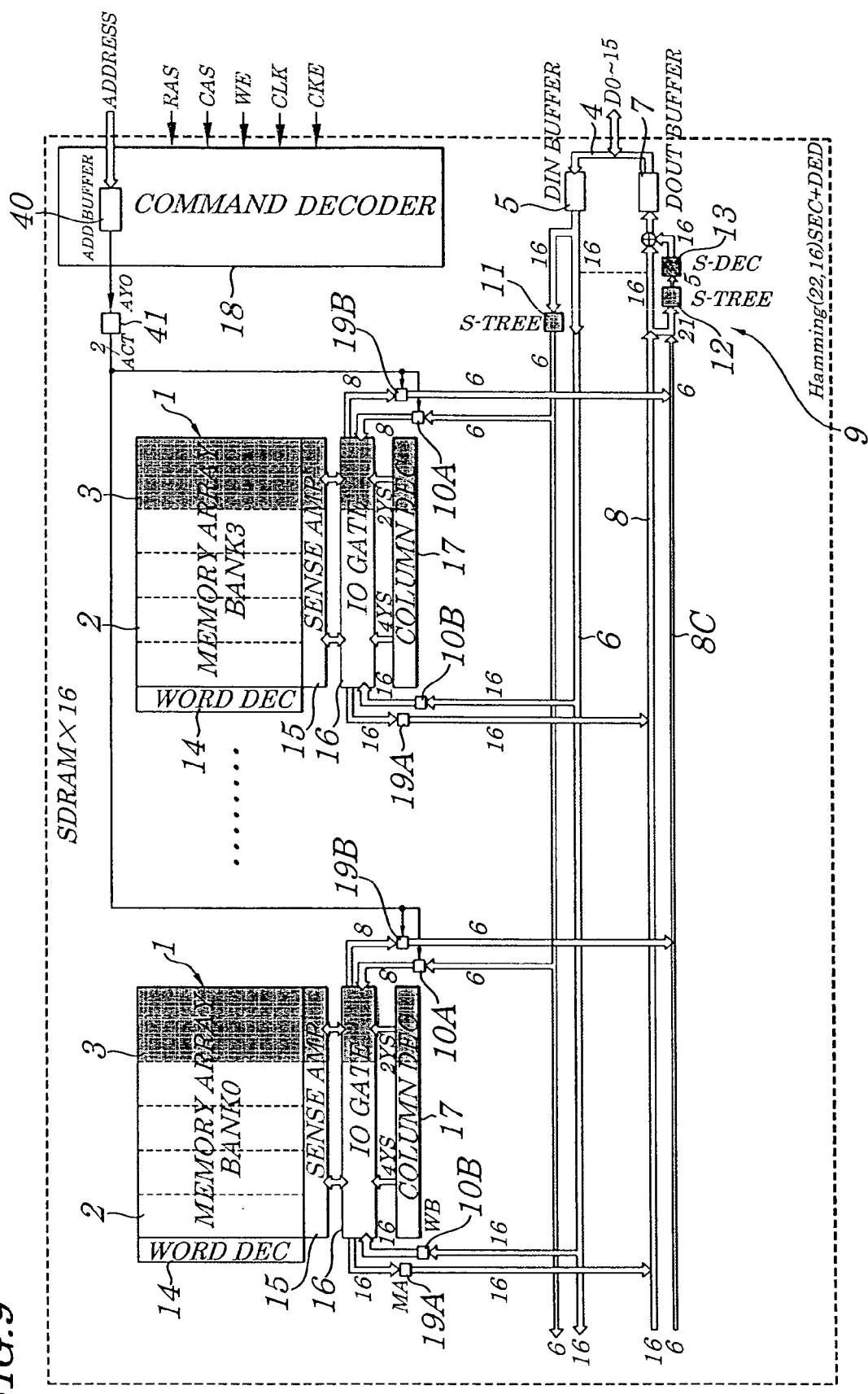
FIG. 9 is a diagram showing configurations of a semiconductor memory device according to a fourth embodiment of the present invention.

FIG. 9 is a diagram showing configurations of a semiconductor memory device according to a fourth embodiment of the present invention. Configurations of the semiconductor memory device of the fourth embodiment differ greatly from those of the above third embodiment in that a 16-bit SDRAM has a Hamming Code (22, 16) SEC+DED. The semiconductor memory device of the fourth embodiment shown in FIG. 9 has approximately the same configurations as those of the third embodiment shown in FIG. 8.

In the semiconductor memory device of the fourth embodiment, 16 bits of data are all handled as information bits and, by adding 6 bits of parity bits to the 16 bits of data, a codeword is constructed and specifications for a DQM are not met. In the semiconductor memory device of the fourth embodiment, the parity bit is increased by one bit when compared with the case of the third embodiment and, by making the parity bit even-numbered, address control for the parity bit is made easy and error correcting capability is slightly increased. Though the Hamming Code (21, 16) SEC of the third embodiment is a Single Error Correcting code (SEC), the Hamming Code (22, 16) SEC+DED of the fourth embodiment is a Single Error Correcting and Double Error Detecting (SEC/DED) code.

According to the semiconductor memory device of the fourth embodiment, since the Hamming Code (22, 16) SEC+DED is provided and 16 bits of data are all handled as information bits and a codeword is constructed by adding 6 bits of parity bits to the 16 bits of data and address control for the parity bit is made easy by making the parity bit even-numbered, error correcting capability can be improved.

Fifth Embodiment

Figure 10:
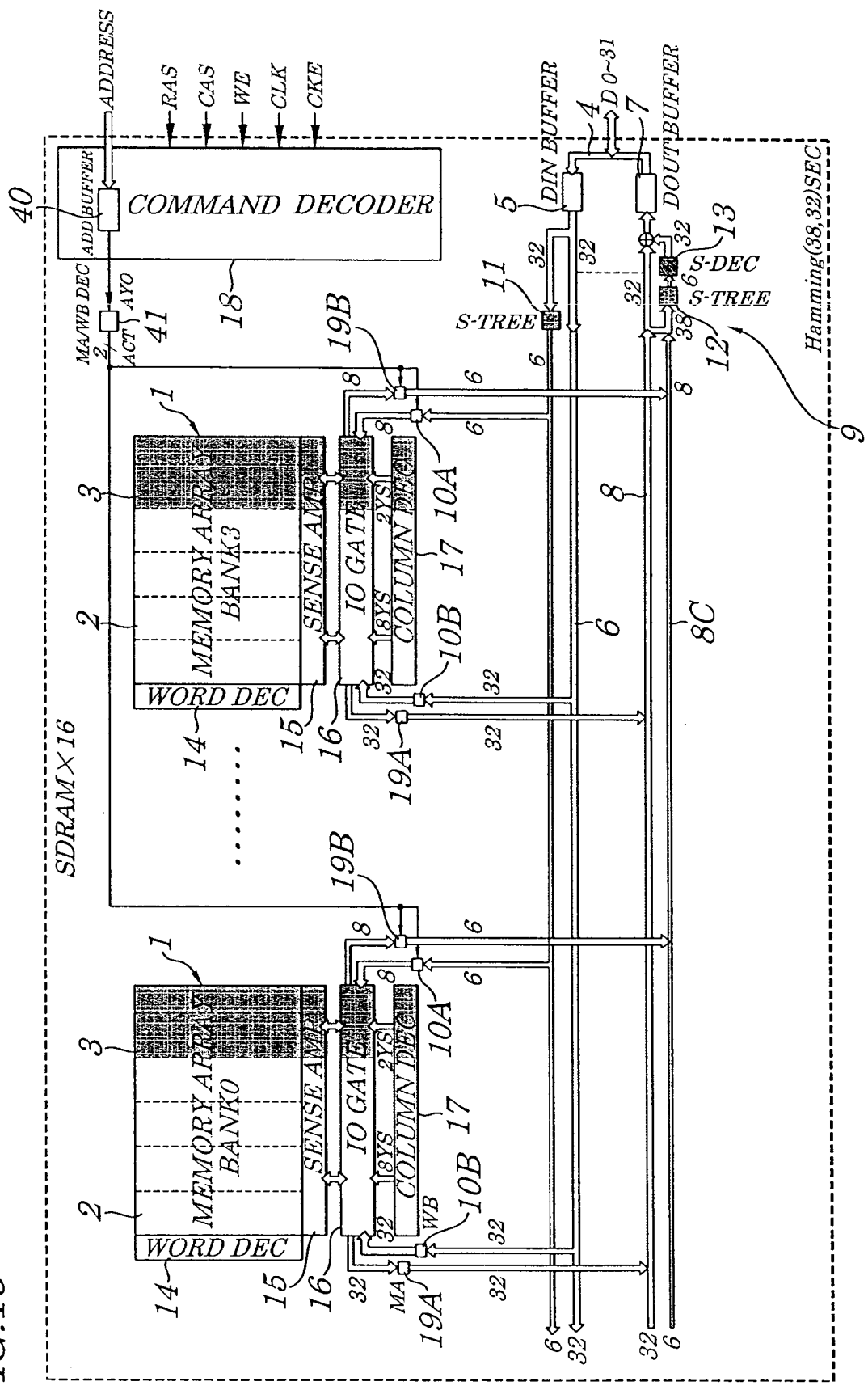
FIG. 10 is a diagram showing configurations of a semiconductor memory device according to a fifth embodiment of the present invention.

FIG. 10 is a diagram showing configurations of a semiconductor memory device according to a fifth embodiment of the present invention. Configurations of the semiconductor memory device of the fifth embodiment differ greatly from those of the above fourth embodiment in that a 32-bit SDRAM has a Hamming Code (38, 32) SEC. The semiconductor memory device of the fifth embodiment shown in FIG. 10 has approximately the same configurations as those of the fourth embodiment shown in FIG. 9. In the semiconductor memory device of the fifth embodiment, 32 bits of data are all handled as information bits and, by adding 6 bits of parity bits to the 32 bits of data, a codeword is constructed, and specifications for a DQM are not met.

In the embodiment, specifications for×32 articles are met and a number of the parity bits for information bits is decreased. The Hamming Code (38, 32) SEC of the fifth embodiment is a Single Error Correcting code (SEC).

According to the semiconductor memory device of the fifth embodiment, since the Hamming Code (38, 32) SEC is provided and 32 bits of data are all handled as information bits and a codeword is constructed by adding 6 bits of parity bits to the 32 bits of data, a number of the parity bits can be decreased by making longer an information bit length and, as a result, area demerits can be reduced more.

Sixth Embodiment

Figure 11:
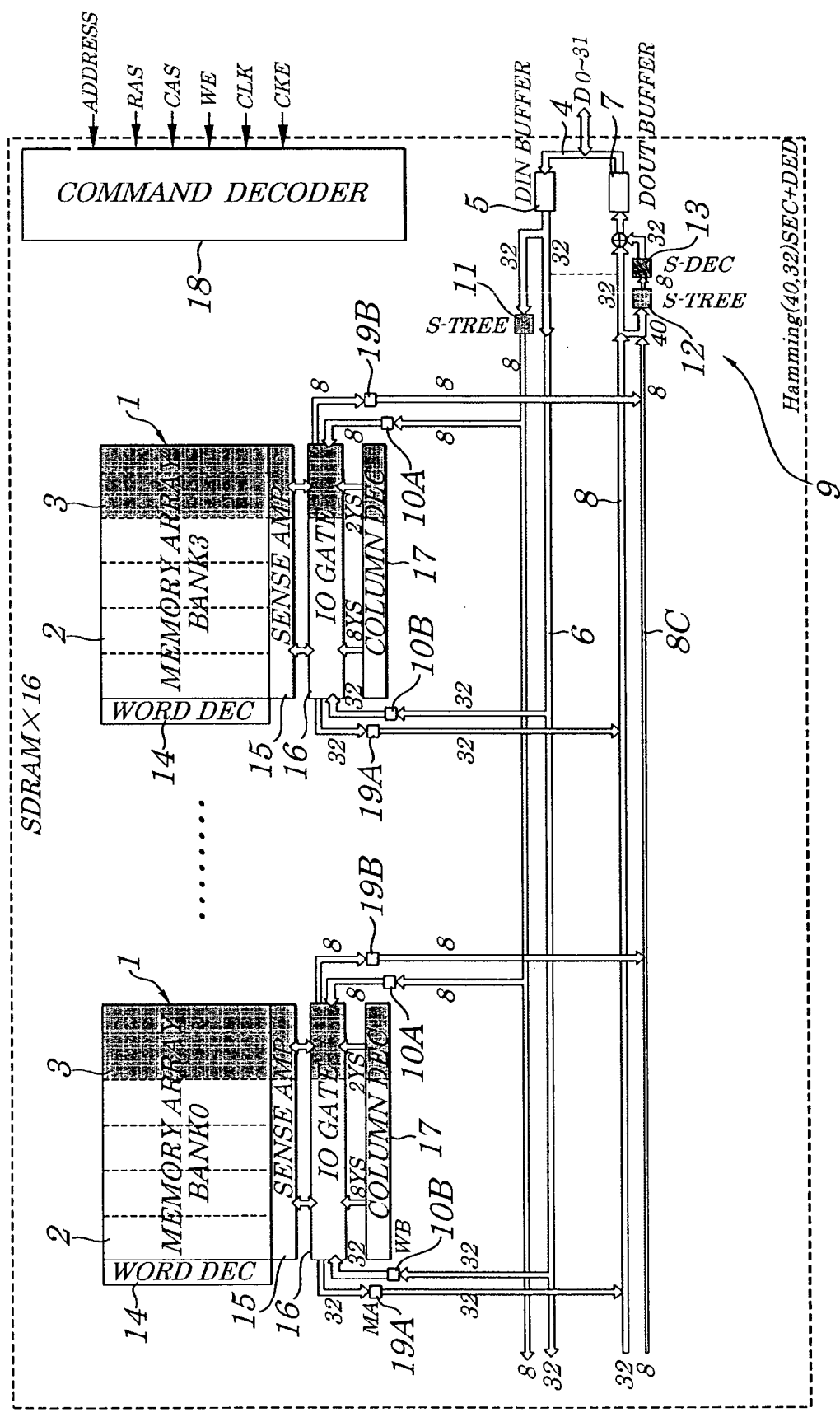
FIG. 11 is a diagram showing configurations of a semiconductor memory device according to a sixth embodiment of the present invention.

FIG. 11 is a diagram showing configurations of a semiconductor memory device according to a sixth embodiment of the present invention. Configurations of the semiconductor memory device of the sixth embodiment differ greatly from those of the above fifth embodiment in that a 32-bit SDRAM has a Hamming Code (40, 32) SEC+DED. In the semiconductor memory device of the sixth embodiment, unlike in the case of the fifth embodiment shown in FIG. 10, an address control circuit for parity bits is not required. In the semiconductor memory device of the sixth embodiment, 32 bits of data are all handled as information bits and, by adding 8 bits of parity bits to the 32 bits of data, a codeword is constructed, and specifications for a DQM are not met. In the semiconductor memory device of the sixth embodiment, by increasing the parity bit by two bits when compared with the case of the fifth embodiment, an address control circuit for the parity bit is made unnecessary and error-correcting capability is slightly improved. A Hamming Code (40, 32) SEC+DED of the sixth embodiment is a Single Error Correcting and Double Error Detecting (SEC/DED) code.

According to the semiconductor memory device of the sixth embodiment, since the Hamming Code (40, 32) (SEC+DED) is provided and 32 bits of data are all handled as information bits and a codeword is constructed by adding 8 bits of parity bits to the 32 bits of data, the use of an address control circuit for the parity bit is made unnecessary and, as a result, error correcting capability can be improved.

Thus, according to each of the above embodiments of the present invention described above, it is made possible to efficiently correct the Pause Refresh Tail distribution, that is, the Pause Refresh failure which has remained a conventional problem and following effects can be obtained.

(1) A refresh period can be extended from about 60 ms (millisecond) being designated in conventional refresh specifications to about 12 ms (in this case, an error rate becomes about 0.01% or less) and a data holding current in a memory cell can be reduced by about one digit.

(2) Since most of failures of a device on a site (failure occurring on a customer side) which are becoming a problem in recent years are single bit errors (one bit error), an occurrence rate of failures of the device on the site can be reduced by about three digits.

(3) A soft error rate can be improved by about three digits (in the case where an error rate is about 0.001%).

(4) Since not only a Pause Refresh failure and a soft error but also a solid failure such as a bit failure can be corrected, a manufacturing yield can be improved by a synergistic effect with a redundant correction and a decrease in numbers of products caused by an increase in a chip size can be offset.

Reasons why such effects described above can be obtained are explained in detail.

Figure 12:
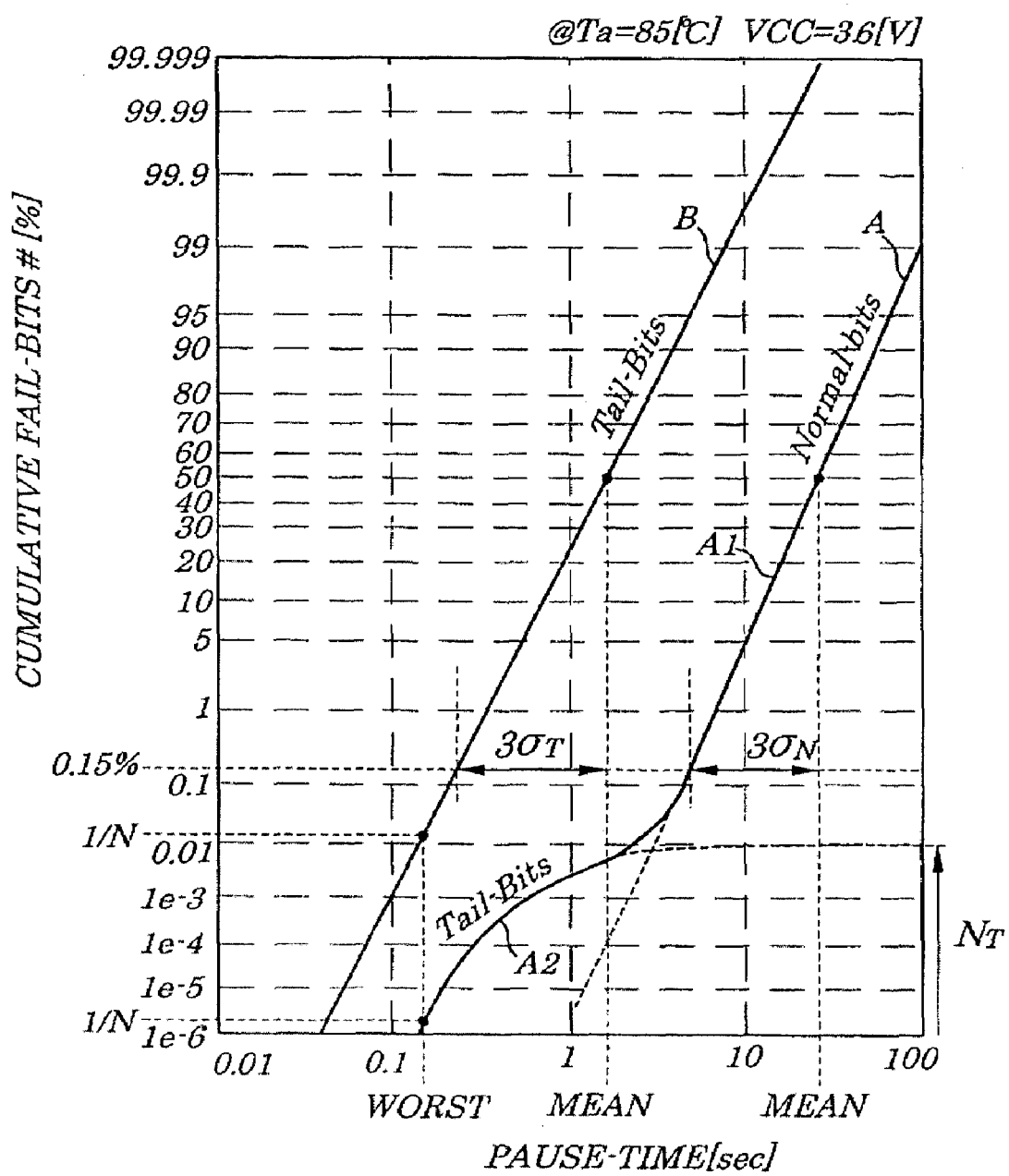
FIG. 12 is a diagram showing a distribution of Pause cumulative degrees to explain a background of the present invention.

(1) According to a result from analysis made by inventors of the present invention on Pause Refresh failures occurred in the past and in our and other manufacturers' products, in order to correct Pause Refresh failures, an error rate must be within a range of about 0.005% to 0.01% and it has been found by the inventor of the present invention that the error rate has an important meaning. As shown in FIG. 12, a Pause Refresh Tail distribution in a memory cell is represented as a relationship between Pause time (PAUSE-TIME) (horizontal axis) and cumulative fail bits numbers (CUMULATIVE FAIL-BITS %) (vertical axis). As described above, the Pause time represents time in a state where, after data has been written into a memory cell, the memory cell is left without anything is done. The number of cumulative fail bits represents cumulative numbers of fail bits obtained by counting the fail bit in every Pause time in a cumulative manner after a Pause Refresh test has been carried out. The number of cumulative fail bits is also equal to an error rate.

As shown in FIG. 12, a characteristic A indicating a Pause Refresh real power of each bit is represented as two Gaussian distributions including a straight-line normal distribution A1 being a good distribution which accounts for about 99.9% of a total distribution and a curved-line Pause Refresh Tail distribution (Pause Refresh failure) A2 being a poor distribution which accounts for remaining about 0.1% of the total distribution. Assuming that all bits are represented as 100%, tail bits in the distribution A2 exist at a probability of about 0.01%. Moreover, a characteristic B represents a distribution obtained when a number of tail bits in the distribution A2 are used as a parameter. A word "WORST" shown in FIG. 12 denotes a worst state and "MEAN" denotes an average state. Here, in order to correct a Pause Refresh failure, the distribution A2 in which a Refresh period can be efficiently lengthened has to be selected as an object to be corrected.

Figure 13:
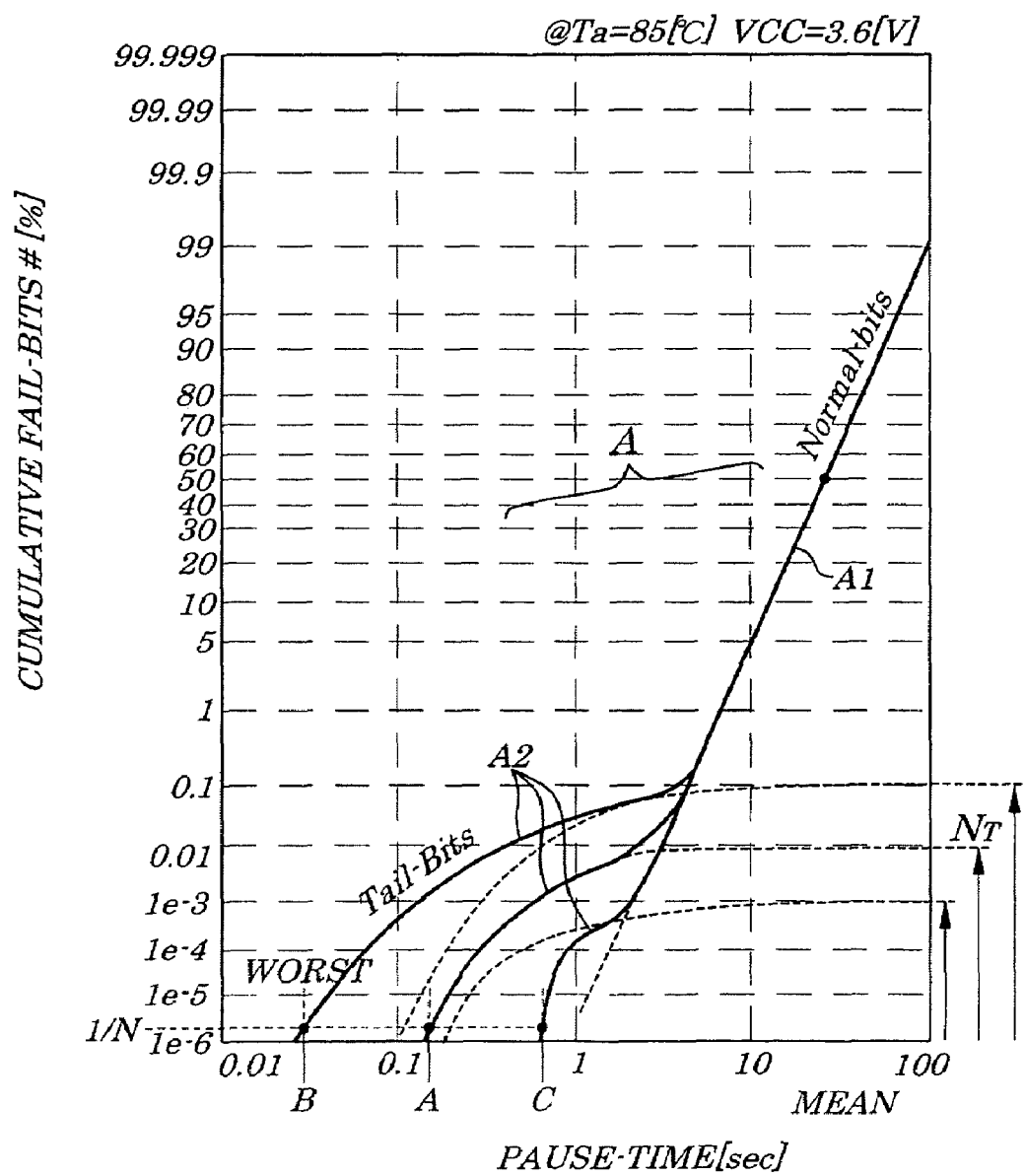
FIG. 13 is also a diagram showing the distribution of Pause cumulative degrees to explain the background of the present invention.
Figure 14:
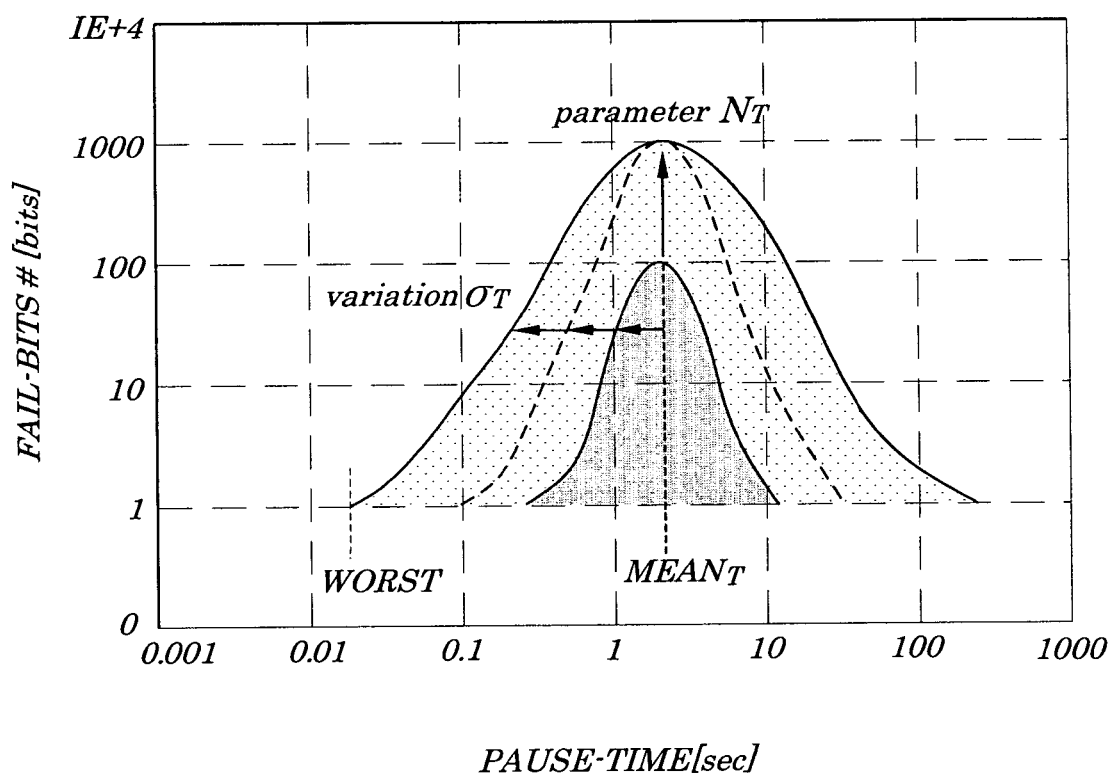
FIG. 14 is a diagram showing a change in a tail distribution in the Pause cumulative degrees employed in the present invention.

Moreover, as shown in FIG. 13, a difference in a Pause Refresh real power, since a difference in the normal distribution A1 is slight irrespective of products of our and other companies, depends on the tail bits distribution A2 (in products of A, B, and C companies). A distribution of the tail bits and the WORST state is characterized by a fact that, due to a total number of tail bits being used as a parameter and variations of its Gaussian distribution, as shown in FIG. 14, almost no change occurs in a mean value of the tail bit distribution, the parameter increases in synchronization with an increase in variations. As a result, if the parameter increases or decreases by one digit, it is assumed that the WORST state changes at most by twice, however, since the WORST state actually becomes worse by a unit of digit, improvement is necessary.

Figure 15:
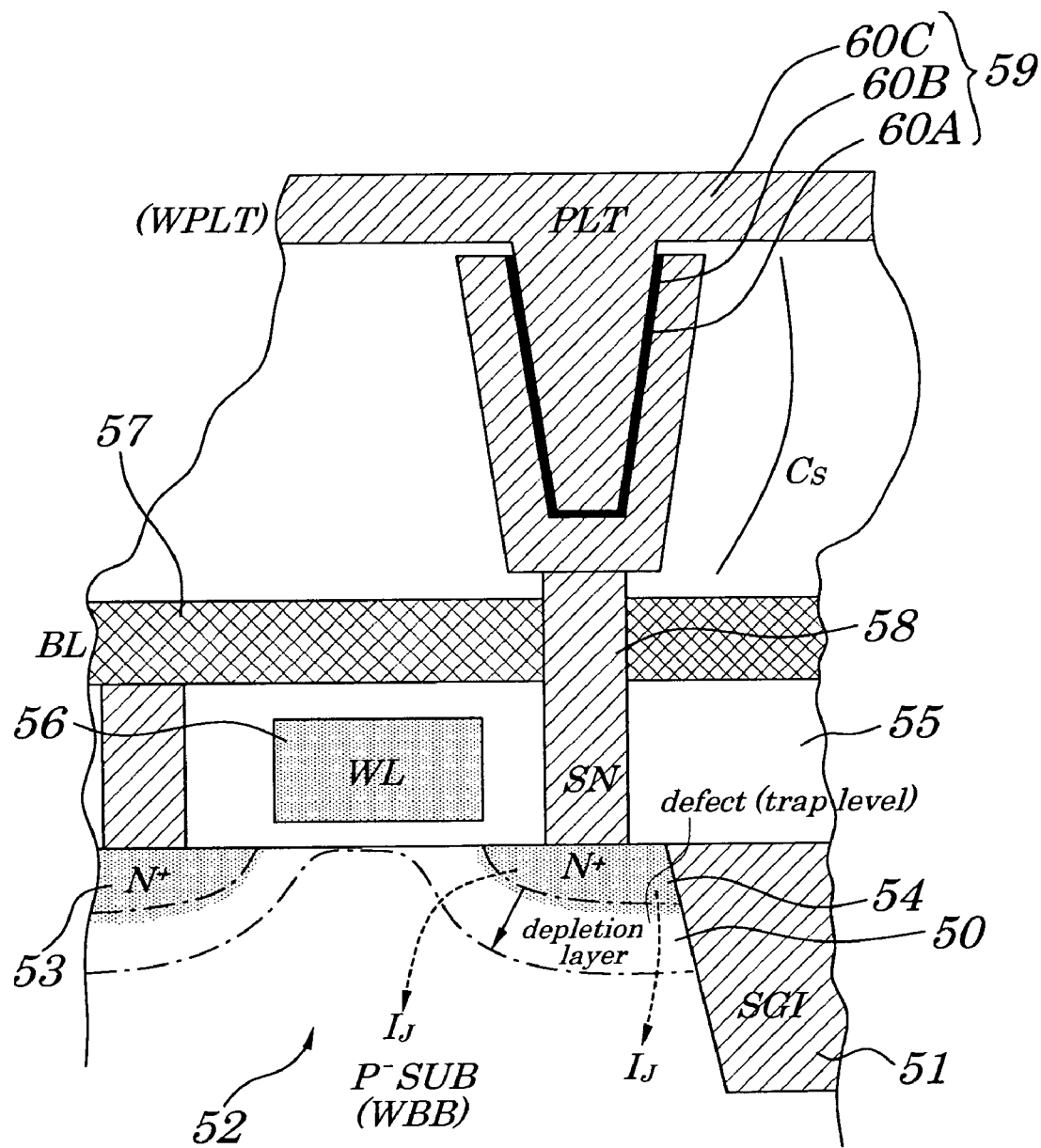
FIG. 15 is a cross-sectional view showing an main component of a memory cell of a DRAM being a semiconductor memory device of the present invention.
Figure 16:
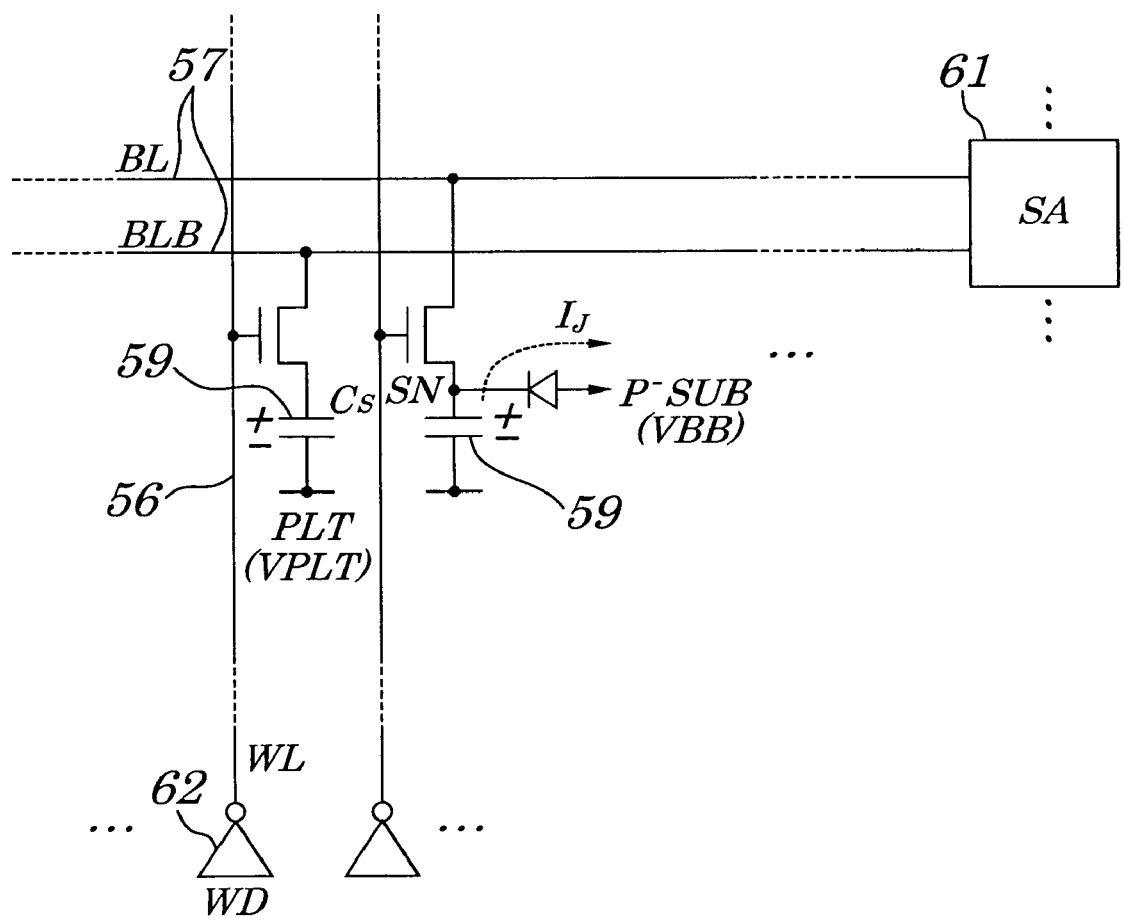
FIG. 16 is a diagram schematically illustrating a driving circuit of the memory cell of FIG. 15.

FIG. 15 is a cross-sectional view showing a main component of a memory cell of a DRAM being a semiconductor memory device of the present invention. FIG. 16 is a diagram schematically illustrating a driving circuit of the memory cell of FIG. 15. In the memory cell, as shown in FIG. 15, a pair of $N^+$-type areas 53 and 54 is formed on a $P^-$-type substrate 52 being separated in an insulated manner in a Shallow Groove Isolation (SGI) area 51 and a word line (WL) 56 is formed in an interlayer dielectric. Moreover, to one $N^+$-type area 53 is connected a bit line (BL) and to another $N^+$-type area 54 is formed a capacitor (CS) 59 with a capacitor contact (SN) 58 being interposed between the $N^+$-type area 54 and the capacitor 59. The capacitor (CS) 59 is made up of a lower electrode 60A, an upper electrode (PLT) 60C, a capacitor insulating film 60B placed between both the electrodes 60A and 60C. The driving circuit, as shown in FIG. 16, is made up of a sense amplifier 61 being connected to the bit line 57 of the memory cell, a word driver 62 being connected to the word line 56, or a like.

While the memory cell shown in FIG. 15 operates, if a pn junction between the $N^+$-type area 54 and the substrate 52 is reverse-biased, a depletion layer 50 extends on a side of the substrate 52. A field intensity distribution in the depletion layer 50 is as shown in FIG. 17.

Reasons why a parameter increases in synchronization with an increase in variations in the Pause Refresh Tail distribution can be explained as follows. The Pause Refresh failure occurs due to a leakage current produced by a reverse-bias voltage applied to the pn-junction of the memory cell shown in FIG. 15 and, in each memory cell, if a wrong defect (trap level) doubling a pn-junction leakage current being parasitic on the capacitor contact 58 in the depletion layer 50 exists, tail bits occur. Existence probability of the defect, as shown in FIG. 17, is much higher (that is, defect density is higher) on a surface of a substrate 52 sustaining damage caused by etching, ion implantation, or a like which are performed during manufacturing of a memory cell. It is thought that there is no great change in the defect density even if optimum design (including adjustment of dose or junction depth, or a like) of a pn-junction portion is performed.

Figure 17:
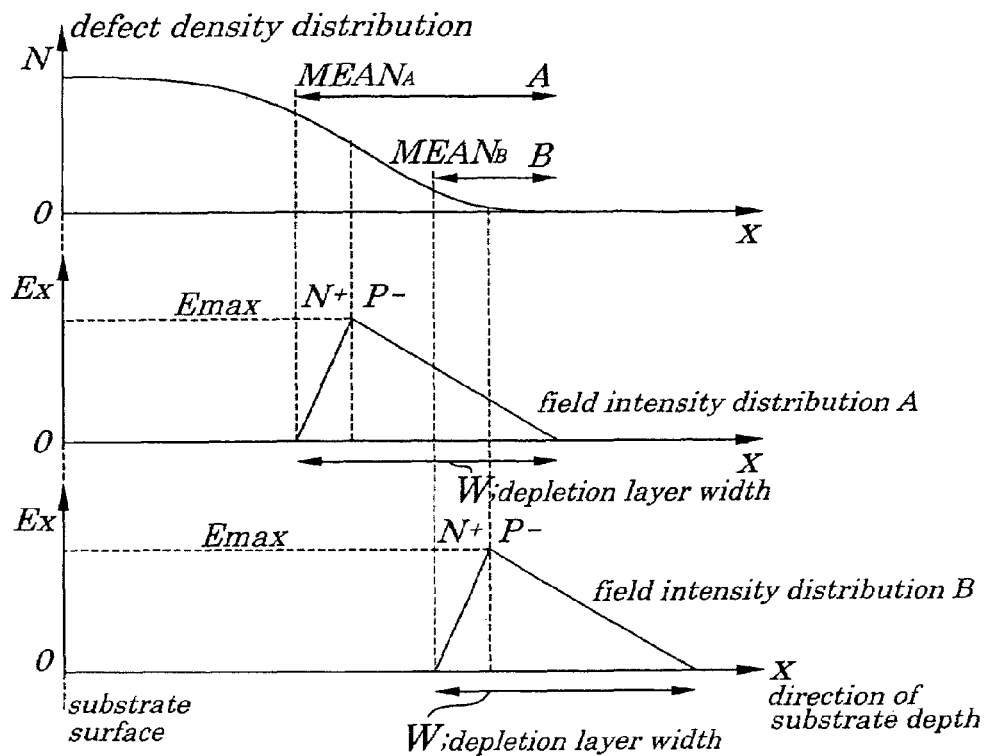
FIG. 17 is a diagram illustrating a field intensity distribution in a depletion layer of the memory cell of FIG. 15.

Now, let it be assumed that, in FIG. 17, a field intensity distribution is moved from A to B. The field intensity distribution, shown in FIG. 17, is obtained by approximating impurity density at the pn-junction by a step junction. For example, it is to be understood that the field intensity distribution B has been formed by performing ion implantation at a low concentration and anneal processing on the capacity contact 58 after the field intensity distribution A has been formed once. Since a junction face in the field intensity distribution B is shifted to a deep position and impurity concentration profile becomes mild, a maximum field (Emax) in the depletion layer decreases and a width of the depletion width is made longer. Since the junction face has become deep, a number of defects existing in the depletion layer in the field intensity distribution decreases. It can be thought that, since the depletion layer width has been made longer, probability of taking in a defect into the depletion layer becomes high, however, since the junction face has been shifted to a deep position, defect density decreases in a unit of a digit and, as a result, a number of tail bits decreases. Moreover, a junction leakage current agrees well with a TAT (Trap Assist Tunneling) and is "$IJ^{\infty}\exp(Emax)$". Since the maximum field (Emax) is decreased in the field intensity distribution B, variations in the junction leakage current are reduced. This is the reason why a parameter of tail bits increases in synchronization with increases in variations in the leakage current.

Figure 18:
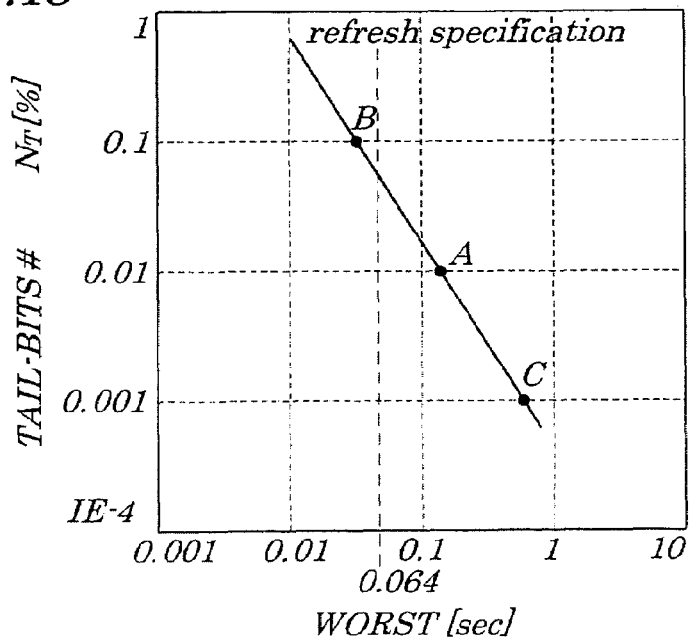
FIG. 18 is a diagram showing a relationship between a number of tail bits and Pause time to explain the background of the present invention.
Figure 19:
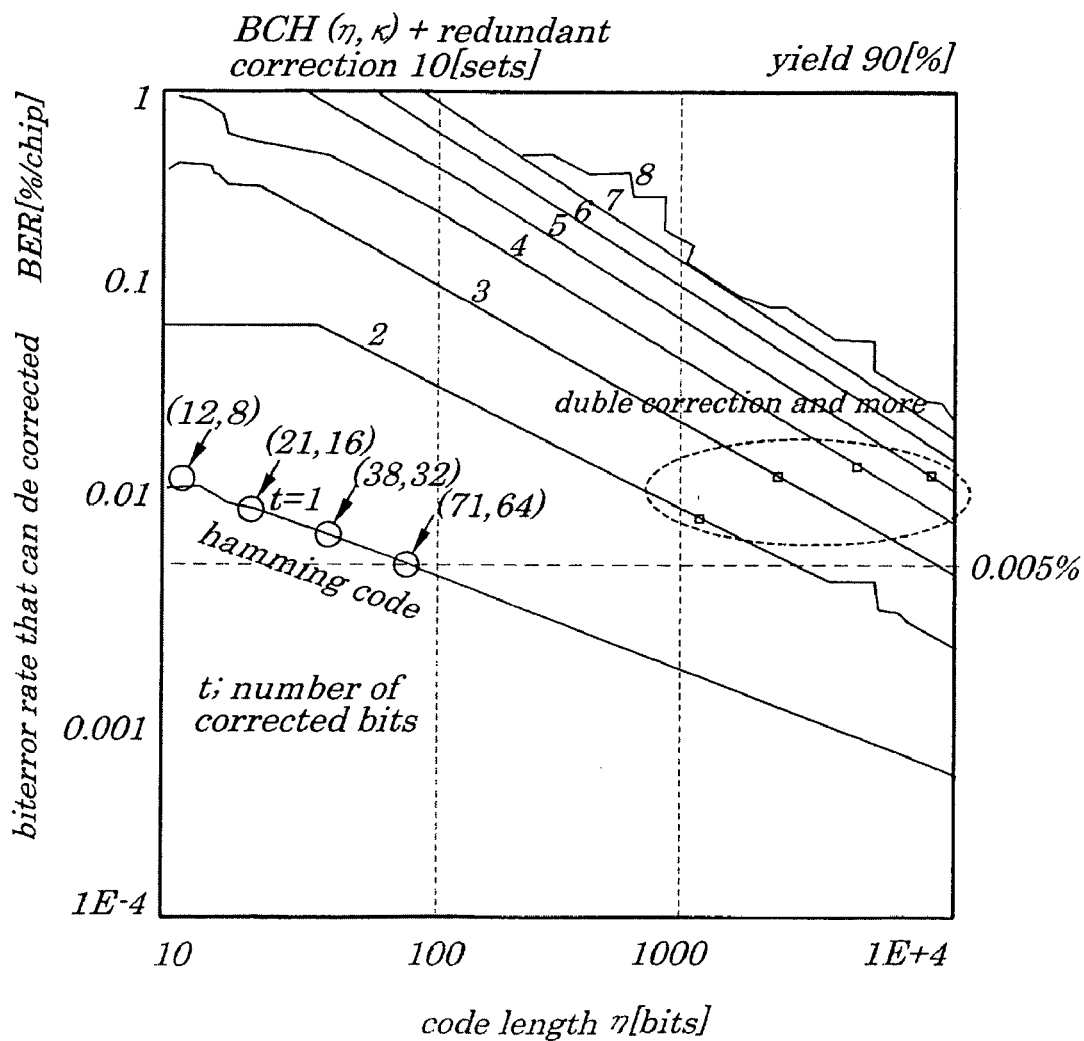
FIG. 19 is a diagram indicating correcting capability of a BCH (Bose-Chaudhuri-Hocquenghen) code to be used for error correction.

It is also found as a result from analysis of the characteristic that parameters of tail bits and the WORST state have a qualitative and quantitative characteristic being fixed to some extent, irrespective of products of our and other companies, as shown in FIG. 18. To satisfy a refresh specification (refresh period is 64 ms), a refresh period of 100 ms being larger twice than the 64 ms is required in an actual WORST state (real power) and, at this point, tail bits necessarily exist at a level of about 0.01%. That is, assuming that the characteristic of a product is at a conventional level (that is, if a product can satisfy a conventional refresh specification), error-correcting capability of the ECC circuit that can correct bits having an error rate of, at worst, 0.01% is satisfactory. More precisely, it is not necessary that the ECC circuit can correct all tail bits and correcting capability to correct bits having an error rate of about 0.005% being about a half of that shown in the Pause cumulative degree distribution is sufficient. If the characteristic requires correcting capability that can correct more of the tail bits, it makes it impossible to satisfy the refresh specification and difficult to have original base products exist.

From a viewpoint of a coding method, when bits having an error rate of 0.01% or more have to be corrected, multiplex correcting processing using a known BCH code or a like is required, however, such the multiplex correcting processing needs a circuit whose size is larger by a unit of digits than a correcting processing using a Hamming Code, which impairs a high-speed operation of a DRAM. By shortening a code length, correcting capability can be increased, even in the case of using a Hamming Code (7, 4) having a shortest code length, an error rate of bits that can be corrected is 0.015% at most.

Even if the present invention is forcibly applied, when a refresh characteristic does not originally satisfy a refresh specification, a conventional refresh period cannot be greatly extended, thus causing its effect to be reduced. The application comes to have no meaning when an area demerit caused by addition of parity bits is considered.

When configurations of the Hamming Code are considered, information bit of a DRAM may be $2^n$ [bits] (in recent years, ($n \geq 2$) bits may be used). At this point, a number of parity bits of the Hamming Code is (N+1) [bits] or more. In actuality, since correcting of bits having an error rate of 0.005% or more is sufficient, from its correcting capability, about 70 [bits] of a code length is an upper limit. Here, since it is necessary to keep a number of parity bits small, a Hamming Code (72, 64) (SEC+DED) becomes actually an upper limit.

Figure 20:
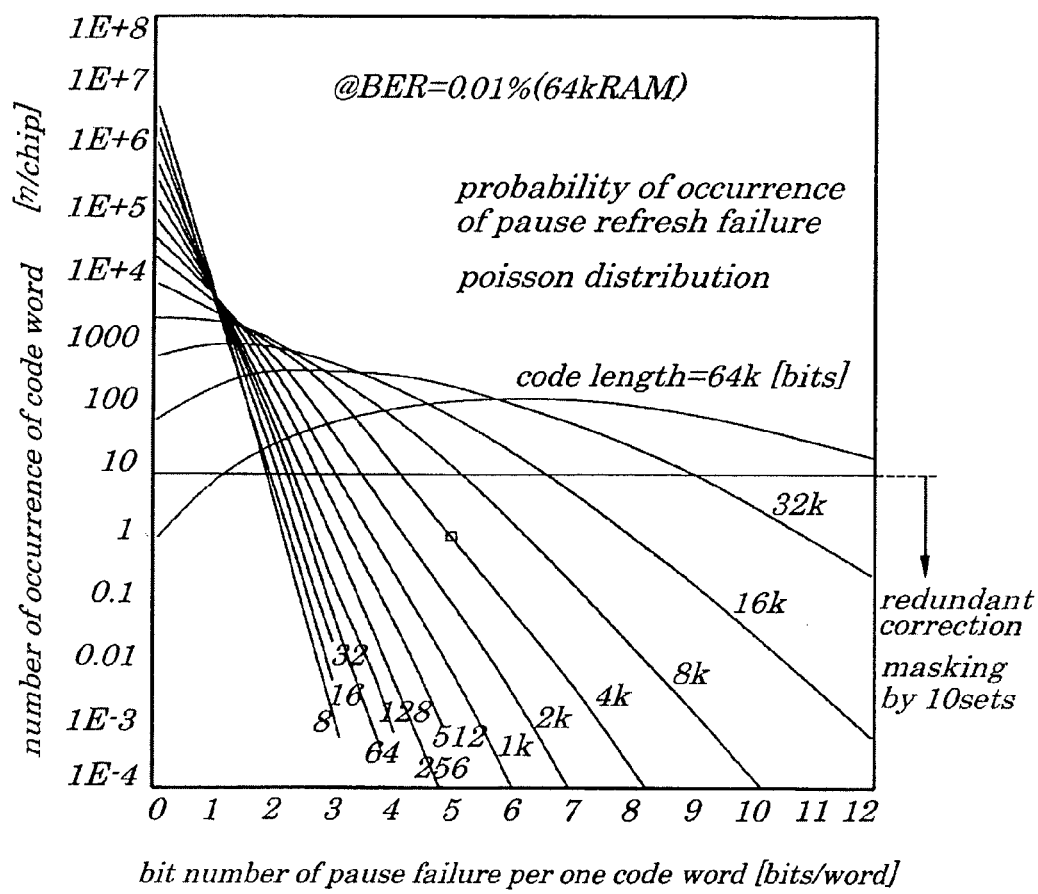
FIG. 20 is a diagram showing a distribution of occurrence of Pause failures.

(2) The Pause Refresh failure has no dependence on an address and a probability of its occurrence agrees well with a Poisson distribution. FIG. 20 shows a result obtained by computing a relationship between a code length and a number of fail bits occurring in a codeword in a 64-Mbit DRAM. When no redundant correction is made, even if a code length is shortened to be 8, a number of occurrence of 2 bit failures that cannot be corrected does not become one or less. This means that good products cannot be obtained only by the Hamming Code. When a multiple correction is made using the BCH code, even if a code length is made as long as 4 K [bits], a probability of occurrence of 5-bit failures by a fourfold correction becomes one or less, which can be at a level of correction. However, its mounting on a DRAM as described above is not realistic. That is, in order to correct Pause Refresh failures by using a Hamming Code, a combined use of the error correction using a Hamming Code with a redundant correction is essential.

Figure 21:
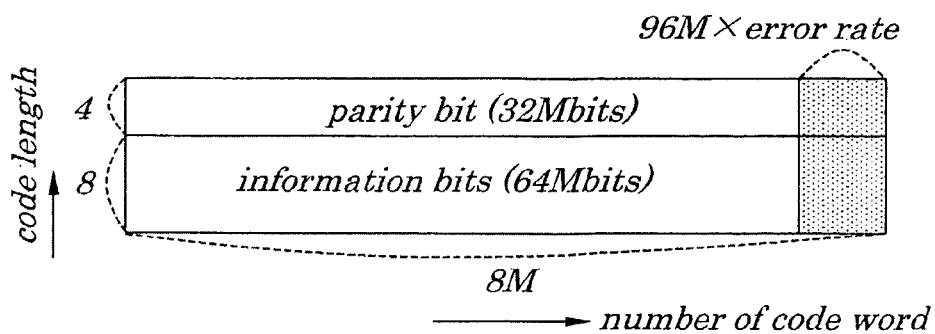
FIG. 21 is a diagram showing one example in which a Hamming Code is applied to a DRAM.

(3) An arithmetic operation is performed on confidence of correction to failures such as a soft error occurring after delivery of products. When the Hamming Code (1, k) is applied and a memory capacity is "M", a number of codewords is given by an expression of "M/K". A number of codewords having one bit failure is given by an expression of "M×1/K×[err] (error rate)". Here, if a new fail bit occurs in a codeword having one fail bit, a chip in which the new fail bit has occurred is handled as a defective bit. If a new one bit failure occurs, its failure rate is obtained by dividing a number of codewords already having one bit failure by all numbers of codewords, that is, 1×[err]. Here, if a refresh period is 512 ms (error rate being 0.001%) and if a Hamming Code (12, 8) is used, its value becomes 120 ppm. It can be understood by this that, even if a codeword is made long from 1 to 72, a result is 720 ppm and that a failure rate of a soft error or a like can be reduced by 3 digits or more. FIG. 21 shows an example in which a Hamming Code (12, 8) is applied to a 64-Mb DRAM.

It is apparent that the present invention is not limited to the above embodiments but may be changed and modified without departing from the scope and spirit of the invention. For example, in the above embodiments, the present invention is applied to the 16-bit type DRAM and the 32-bit type DRAM, however, the present invention is not limited to this. That is, the present invention may be applied to a 4-bit type DRAM or an 8-bit type DRAM.

What is claimed is:

1. A semiconductor memory device comprising:
  an SDRAM array made up of a plurality of memory cells and having an information bit area wherein information bits are written in and/or read from and a parity bit area wherein parity bits are written in and/or read from, and a redundant circuit to replace error bits contained in at least one of said information bits and said parity bits; and
  an error correcting code (ECC) circuit to perform error correcting processing, using a Hamming Code on data including said information bits and said parity bits being written in and/or read from said information bit area and said parity bit area, respectively, in said SDRAM array,
  wherein use of redundant correcting processing to correct said error bits using a redundant circuit in said SDRAM array is combined with said error correcting processing using said Hamming Code in said error correcting code (ECC) circuit, and
  wherein said error correcting code circuit comprises a plurality of divided error correcting code circuits provided independently of each other for each independent data mask block and controlled by independent data mask signals as external signals.

2. The semiconductor memory device according to claim 1, wherein, when reading process is performed on said information bit area or said parity bit area, said read data on which said error correcting processing has been performed is output to only an outside of said SDRAM array without being rewritten into said information bit area or said parity area.

3. The semiconductor memory device according to claim 1, wherein, when a codeword made up of bits is beyond a correcting capability of said error correcting processing using said Hamming Code, said redundant correction processing is performed on said error bits using said redundant circuit.

4. The semiconductor memory device according to claim 1, wherein said error correcting code (ECC) circuit comprises an encoding circuit to output, by arithmetic operations, said parity bit corresponding to said information bit, a decoding circuit to output an error location detecting signal indicating an error bit out of all bits contained in said codeword, and an error correcting circuit to input said error location detecting signal and to output an error bit in a reverse manner.

5. The semiconductor memory device according to claim 4, wherein said encoding circuit comprises a syndrome tree in which a plurality of AND circuits to which a first test signal is fed is connected to a plurality of exclusive OR circuits in a manner to provide a specified relationship.

6. The semiconductor memory device according to claim 4, wherein said decoding circuit comprises a syndrome tree in which a plurality of exclusive OR circuits is connected to one another so that a plurality of bits of said information bits and a plurality of bits of said parity bits are input and a plurality of bits of syndromes is output and decoders to which a plurality of NAND circuits to which a plurality of bits of said syndromes is input and in which a plurality of bits of said error location detecting signals are output and a plurality of AND circuits to which a second test signal is fed are connected to one another in a manner to provide a specified relationship.

7. The semiconductor memory device according to claim 4, wherein, in said error correcting circuit, a plurality of exclusive OR circuits to which a plurality of bits of said error location detecting signals is input together with a plurality of bits of said information bits and a plurality of bits of said parity bits and a plurality of switches to which a third test signal is fed are connected to one another in a manner to provide a specified relationship so that said error bits are output in a reverse manner.

8. A semiconductor memory device comprising:
an SDRAM array made up of a plurality of memory cells and having an information bit area wherein information bits are written in and/or read from and a parity bit area wherein parity bits are written in and/or read from, and a redundant circuit to replace error bits contained in at least one of said information bits and said parity bits; and
an error correcting code (ECC) circuit to perform error correcting processing, using a Hamming Code whose code length is 72 or less on data including said information bits and said parity bits being written in and/or read from said information bit area and said parity bit area, respectively, in said SDRAM array,
wherein use of redundant correcting processing to correct said error bits using a redundant circuit in said SDRAM array is combined with said error correcting processing using said Hamming Code in said error correcting code (ECC) circuit, and
wherein said error correcting code circuit comprises a plurality of divided error correcting code circuits provided independently of each other for each independent data mask block and controlled by independent data mask signals as external signals.

9. The semiconductor memory device according to claim 8, wherein, when reading process is performed on said information bit area or said parity bit area, said read data on which said error correcting processing has been performed is output to only an outside of said SDRAM array without being rewritten into said information bit area or said parity area.

10. The semiconductor memory device according to claim 8, wherein, when a codeword made up of bits is beyond a correcting capability of said error correcting processing using said Hamming Code, said redundant correction processing is performed on said error bits using said redundant circuit.

11. The semiconductor memory device according to claim 8, wherein said error correcting code (ECC) circuit comprises an encoding circuit to output, by arithmetic operations, said parity bit corresponding to said information bit, a decoding circuit to output an error location detecting signal indicating an error bit out of all bits contained in said codeword, and an error correcting circuit to input said error location detecting signal and to output an error bit in a reverse manner.

12. The semiconductor memory device according to claim 11, wherein said encoding circuit comprises a syndrome tree in which a plurality of AND circuits to which a first test signal is fed is connected to a plurality of exclusive OR circuits in a manner to provide a specified relationship.

13. The semiconductor memory device according to claim 11, wherein said decoding circuit comprises a syndrome tree in which a plurality of exclusive OR circuits is connected to one another so that plurality of bits of said information bits and a plurality of bits of said parity bits are input and a plurality of bits of syndromes is output and decoders to which a plurality of NAND circuits to which a plurality of bits of said syndromes is input and in which a plurality of bits of said error location detecting signals are output and a plurality of AND circuits to which a second test signal is fed are connected to one another in a manner to provide a specified relationship.

14. The semiconductor memory device according to claim 11, wherein said error correcting circuit, a plurality of exclusive OR circuits to which a plurality of bits of said error location detecting signals is input together with a plurality of bits of said ingormation bits and a plurality of bits of said parity bits and a plurality of switches to which a third test signal is fed are connected to one another in a manner to provide a specified relationship so that said error bits are output in a reverse manner.

* * * * *